United States Patent
Chang et al.

(10) Patent No.: US 10,665,513 B2
(45) Date of Patent: May 26, 2020

(54) FIN FIELD-EFFECT TRANSISTOR DEVICE AND METHOD

(71) Applicant: Taiwan Semiconductor Manufacturing Company, Ltd., Hsinchu (TW)

(72) Inventors: Ming-Ching Chang, Hsinchu (TW); Bao-Ru Young, Zhubei (TW); Yu Chao Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/206,471

(22) Filed: Nov. 30, 2018

(65) Prior Publication Data

US 2019/0109053 A1    Apr. 11, 2019

Related U.S. Application Data

(62) Division of application No. 15/693,202, filed on Aug. 31, 2017, now Pat. No. 10,236,220.

(51) Int. Cl.
*H01L 21/8238* (2006.01)
*H01L 21/28* (2006.01)
(Continued)

(52) U.S. Cl.
CPC ........ *H01L 21/823857* (2013.01); *H01L 21/28088* (2013.01); *H01L 21/823821* (2013.01); *H01L 21/823828* (2013.01); *H01L 27/0924* (2013.01); *H01L 29/4966* (2013.01); *H01L 29/66545* (2013.01); *H01L 21/845* (2013.01)

(58) Field of Classification Search
CPC ....... H01L 21/823857; H01L 21/28088; H01L 21/823821; H01L 21/823828; H01L 27/0924; H01L 29/4966; H01L 29/66545; H01L 29/66742; H01L 29/7855
See application file for complete search history.

(56) References Cited

U.S. PATENT DOCUMENTS

| 8,487,378 | B2 | 7/2013 | Goto et al. |
| 8,729,634 | B2 | 5/2014 | Shen et al. |
| 8,826,213 | B1 | 9/2014 | Ho et al. |

(Continued)

FOREIGN PATENT DOCUMENTS

| KR | 20130054900 A | 5/2013 |
| KR | 20160094244 A | 8/2016 |

(Continued)

*Primary Examiner* — Victor A Mandala
(74) *Attorney, Agent, or Firm* — Slater Matsil, LLP

(57) ABSTRACT

A method includes removing a first portion of a dummy gate structure over a first fin while keeping a second portion of the dummy gate structure over a second fin, where removing the first portion forms a first recess exposing the first fin, forming a first gate dielectric material in the first recess and over the first fin, and removing the second portion of the dummy gate structure over the second fin, where removing the second portion forms a second recess exposing the second fin. The method further includes forming a second gate dielectric material in the second recess and over the second fin, the second gate dielectric material contacting the first gate dielectric material, and filling the first recess and the second recess with a conductive material.

20 Claims, 25 Drawing Sheets

(51) Int. Cl.
  *H01L 27/092* (2006.01)
  *H01L 29/49* (2006.01)
  *H01L 29/66* (2006.01)
  *H01L 21/84* (2006.01)

(56) References Cited

U.S. PATENT DOCUMENTS

| | | |
|---|---|---|
| 8,887,106 B2 | 11/2014 | Ho et al. |
| 2013/0126977 A1 | 5/2013 | Chuang et al. |
| 2014/0282326 A1 | 9/2014 | Chen et al. |
| 2014/0308808 A1* | 10/2014 | Cheng .............. H01L 29/66545 438/595 |
| 2014/0370699 A1* | 12/2014 | Kim ................. H01L 21/28008 438/587 |
| 2015/0014780 A1* | 1/2015 | Kim .................... H01L 27/0924 257/369 |
| 2015/0206876 A1* | 7/2015 | Alptekin ............ H01L 27/0886 257/192 |
| 2015/0380305 A1* | 12/2015 | Basker .............. H01L 21/76846 257/77 |
| 2016/0225764 A1 | 8/2016 | Chang et al. |
| 2017/0133486 A1* | 5/2017 | Zhou ............... H01L 21/823857 |
| 2017/0133489 A1* | 5/2017 | Zhou ............... H01L 21/823462 |
| 2017/0141112 A1* | 5/2017 | Ching ................ H01L 27/0924 |
| 2017/0200803 A1* | 7/2017 | Lee ....................... H01L 29/511 |
| 2018/0166560 A1* | 6/2018 | Chiang ............. H01L 21/82345 |
| 2018/0248039 A1* | 8/2018 | Hafez ............... H01L 29/66545 |

FOREIGN PATENT DOCUMENTS

| | | |
|---|---|---|
| TW | 201445694 | 12/2014 |
| TW | 201705232 | 2/2017 |
| TW | 201727833 | 8/2017 |

\* cited by examiner

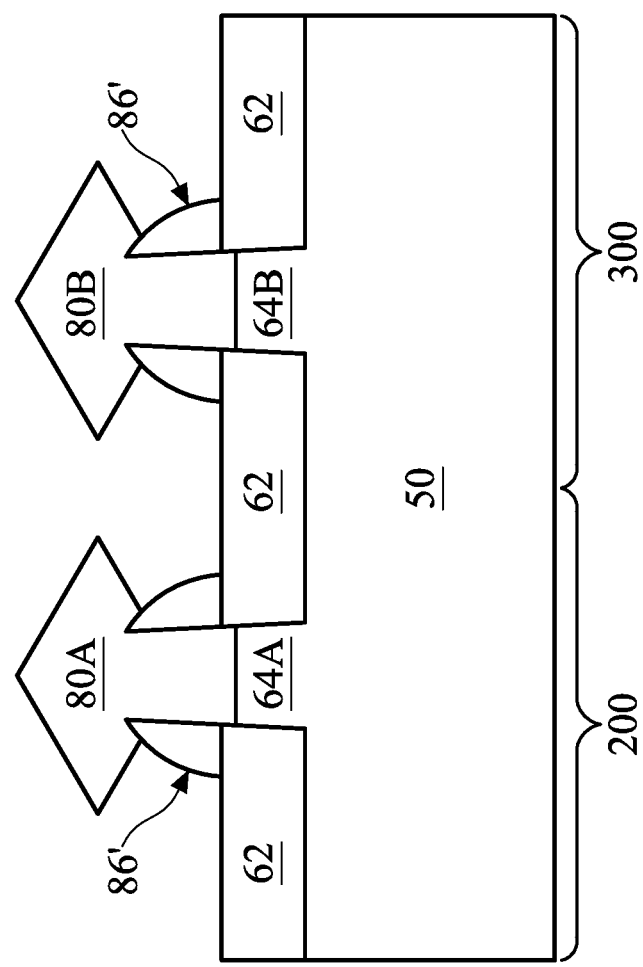

US 10,665,513 B2

1

FIN FIELD-EFFECT TRANSISTOR DEVICE AND METHOD

PRIORITY CLAIM AND CROSS-REFERENCE

This patent application is a divisional and claims priority to U.S. patent application Ser. No. 15/693,202, filed on Aug. 31, 2017, and entitled "Fin Field-Effect Transistor Device and Method," which application is hereby incorporated by reference herein as if reproduced in its entirety.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

Fin Field-Effect Transistor (FinFET) devices are becoming commonly used in integrated circuits. FinFET devices have a three-dimensional structure that comprises a semiconductor fin protruding from a substrate. A gate structure, configured to control the flow of charge carriers within a conductive channel of the FinFET device, wraps around the semiconductor fin. For example, in a tri-gate FinFET device, the gate structure wraps around three sides of the semiconductor fin, thereby forming conductive channels on three sides of the semiconductor fin.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2-6, 7A, 7B, 7C, 7D, and 8-21 illustrate cross-sectional views of a FinFET device at various stages of fabrication, in accordance with some embodiments.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element

2 or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure are discussed in the context of forming a FinFET device, and in particular, in the context of forming replacement gates of a FinFET device. In accordance with some embodiments, a dummy gate over a first fin and over a second fin is replaced by a first gate structure over the first fin and a second gate structure over the second fin. The first gate structure contacts the second gate structure, with the gate dielectric material of the first gate structure and the gate dielectric material of the second gate structure disposed between the two gate structures and forming an insulation region between the two gate structures. A small fin-to-fin pitch is achieved due to the insulation region formed by the gate dielectric materials.

Figure 1:
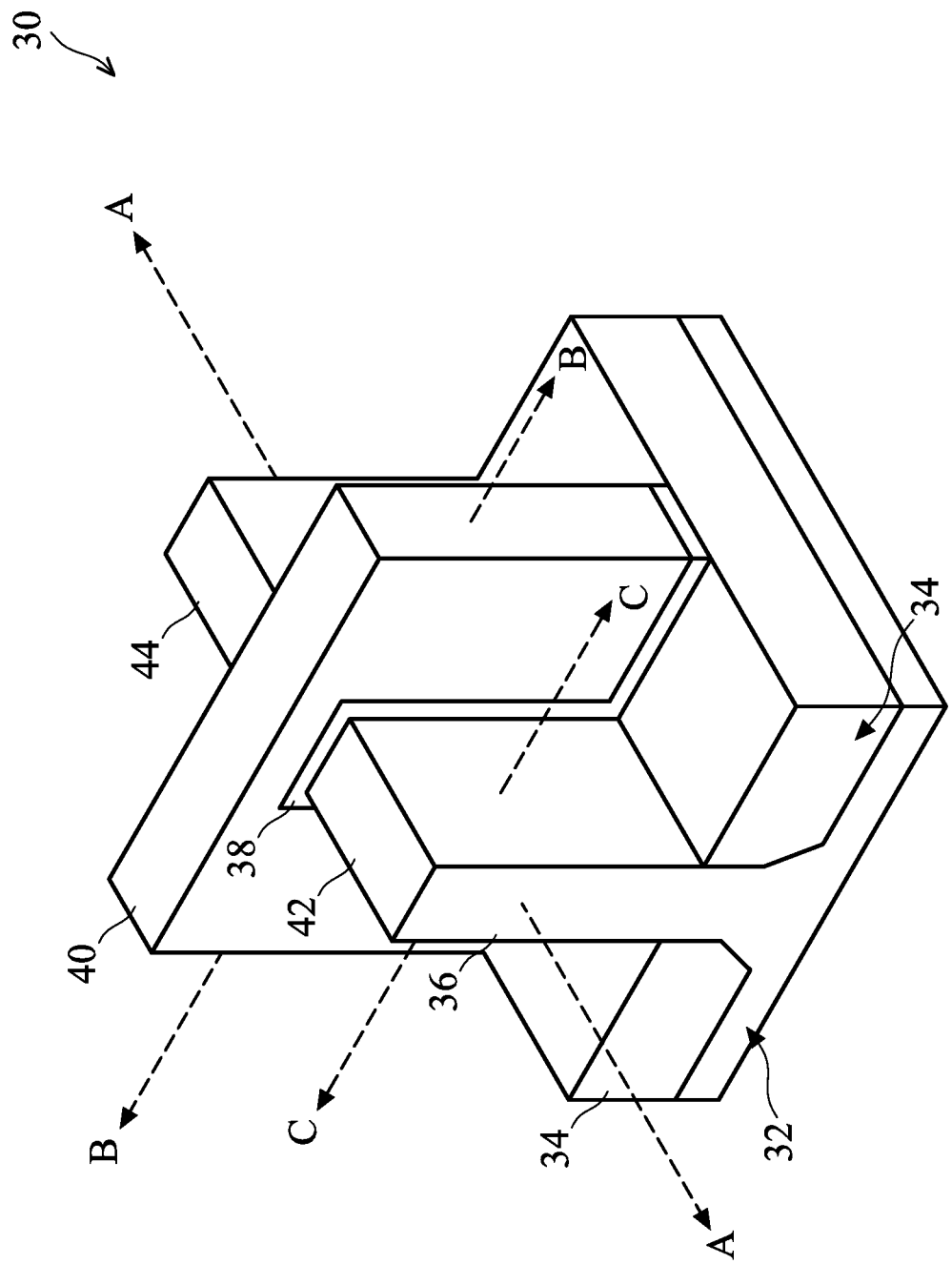
FIG. 1 illustrates a perspective view of a Fin Field-Effect Transistor (FinFET) device, in accordance with some embodiments.

FIG. 1 illustrates an example of a FinFET 30 in a perspective view. The FinFET 30 includes a substrate 32 having a fin 36. The substrate 32 has isolation regions 34 formed thereon, and the fin 36 protrudes above and between neighboring isolation regions 34. A gate dielectric 38 is along sidewalls and over a top surface of the fin 36, and a gate electrode 40 is over the gate dielectric 38. Source/drain regions 42 and 44 are in the fin on opposite sides of the gate dielectric 38 and gate electrode 40. FIG. 1 further illustrates reference cross-sections that are used in later figures. Cross-section B-B extends along a longitudinal axis of the gate electrode 40 of the FinFET 30. Cross-section A-A is perpendicular to cross-section B-B and is along a longitudinal axis of the fin 36 and in a direction of, for example, a current flow between the source/drain regions 42 and 44. Cross-section C-C is parallel to cross-section B-B and is across the source/drain region 42. Subsequent figures refer to these reference cross-sections for clarity.

Figure 6:
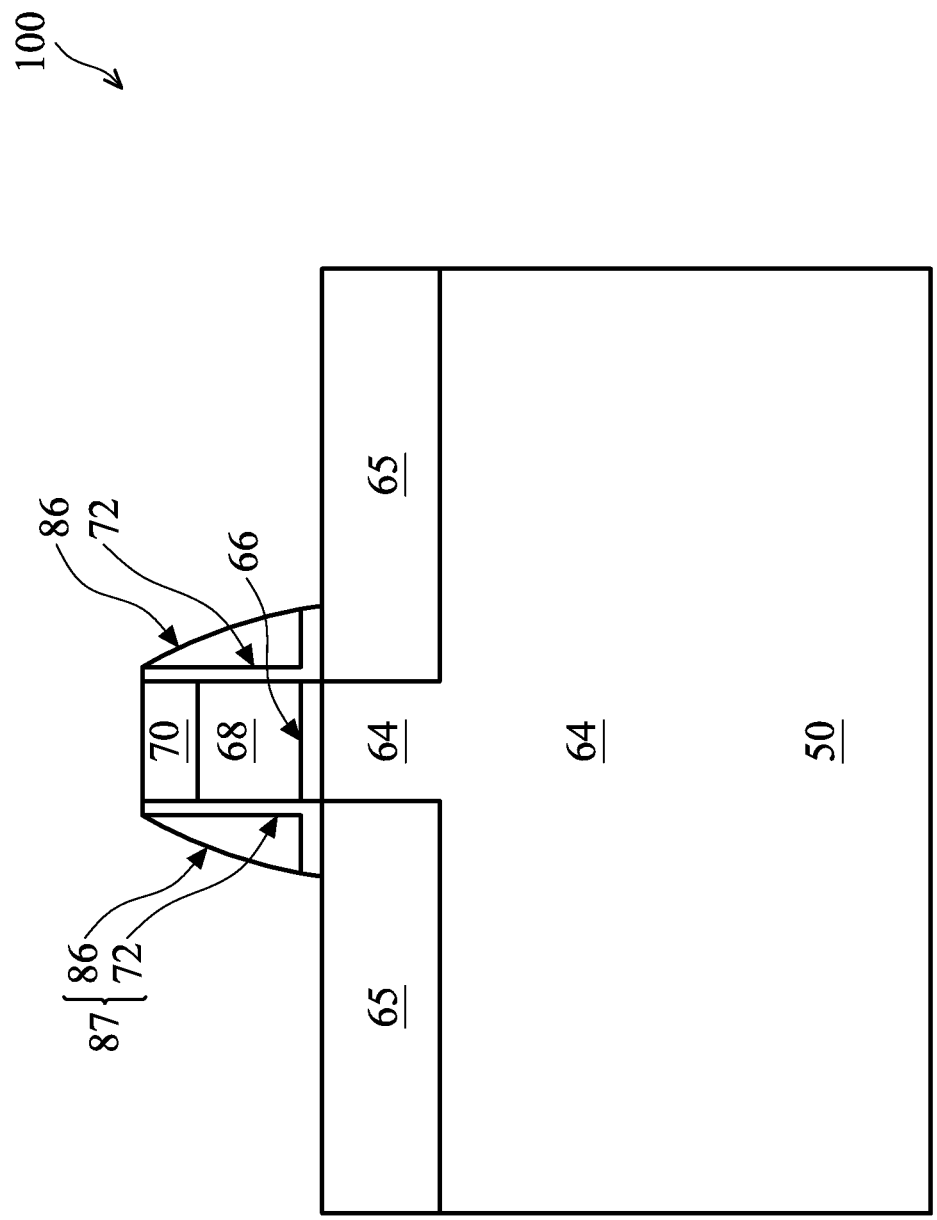
Figure 7A:
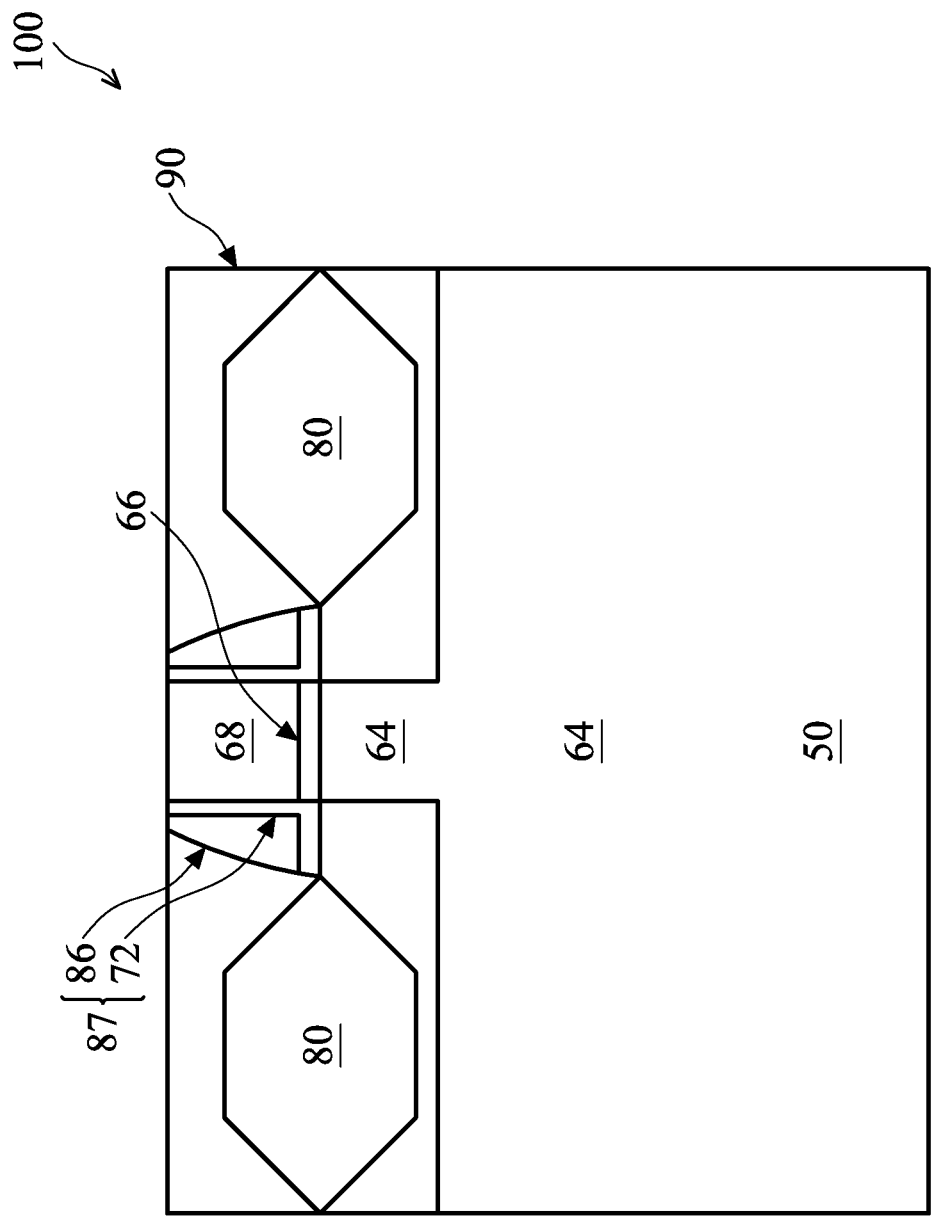
Figure 7B:
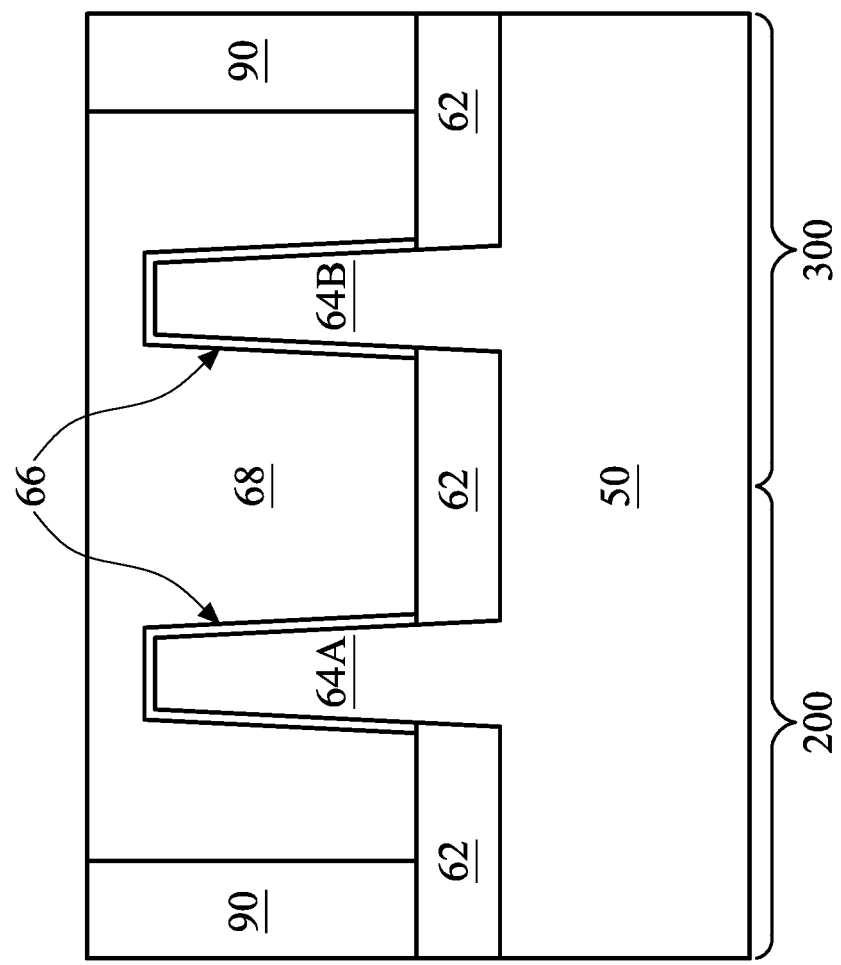
Figure 7C:
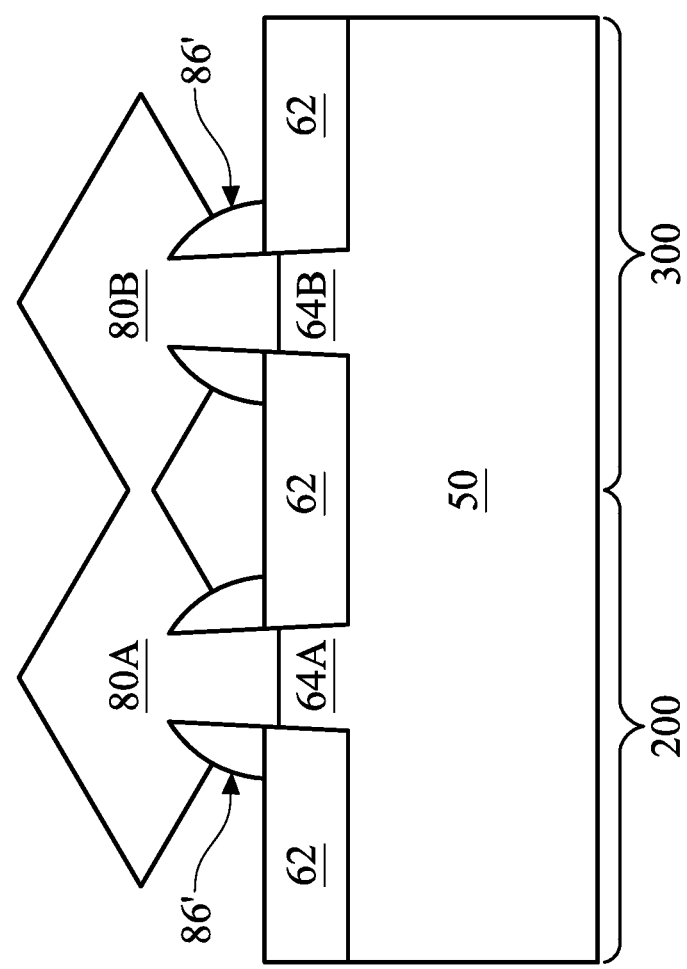

FIGS. 2-21 are cross-sectional views of a FinFET device 100 at various stages of fabrication in accordance with an embodiment. The FinFET device 100 is similar to the FinFET 30 in FIG. 1, except for multiple fins. FIGS. 2-5 illustrate cross-section views of a FinFET device 100 along cross-section B-B. FIGS. 6 and 7A illustrate cross-section views of the FinFET device 100 along cross-section A-A, FIG. 7B illustrate a cross-section view of the FinFET device 100 along cross-section B-B, and FIGS. 7C and 7D illustrate cross-section views of the FinFET device 100 along cross-section C-C. FIGS. 8-21 illustrate cross-section views of the FinFET device 100 along cross-section B-B.

Figure 2:
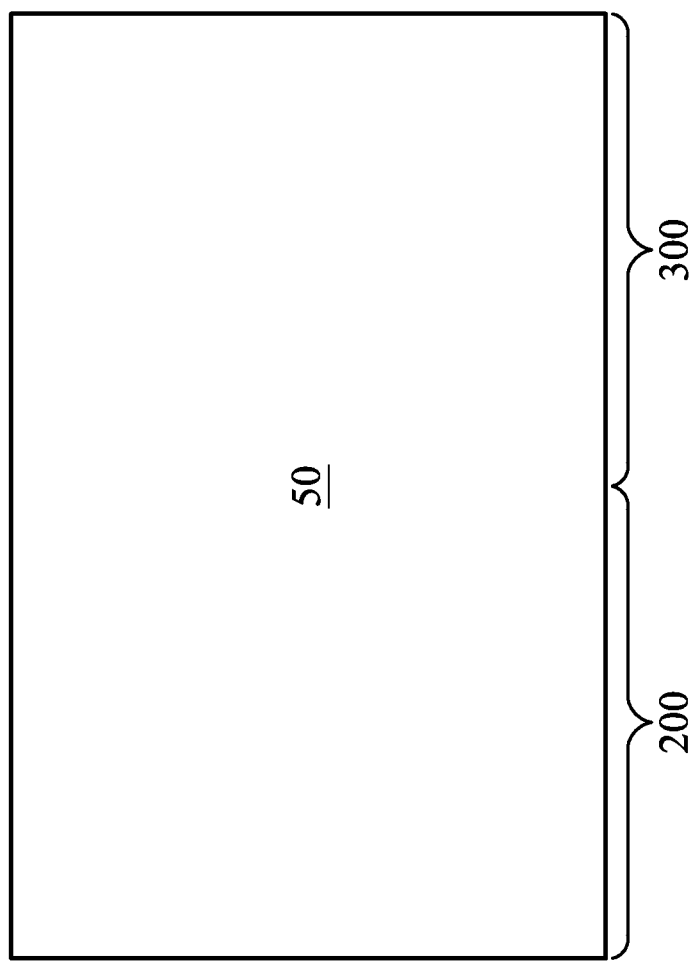

FIG. 2 illustrates a cross-sectional view of a substrate 50. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

As illustrated in FIG. 2, the substrate includes a first portion in region 200, and a second portion in region 300. The first portion of the substrate 50 in region 200 may be used to form P-type devices such as P-type metal-oxide-semiconductor field-effect transistors (MOSFETs), and the second portion of the substrate 50 in region 300 may be used to form N-type devices such as N-type MOSFETs. Therefore, the region 200 may be referred to as a PMOS region, and the region 300 may be referred to as an NMOS region in some embodiments. In other embodiments, both region 200 and region 300 are PMOS regions or NMOS regions.

Figure 3:
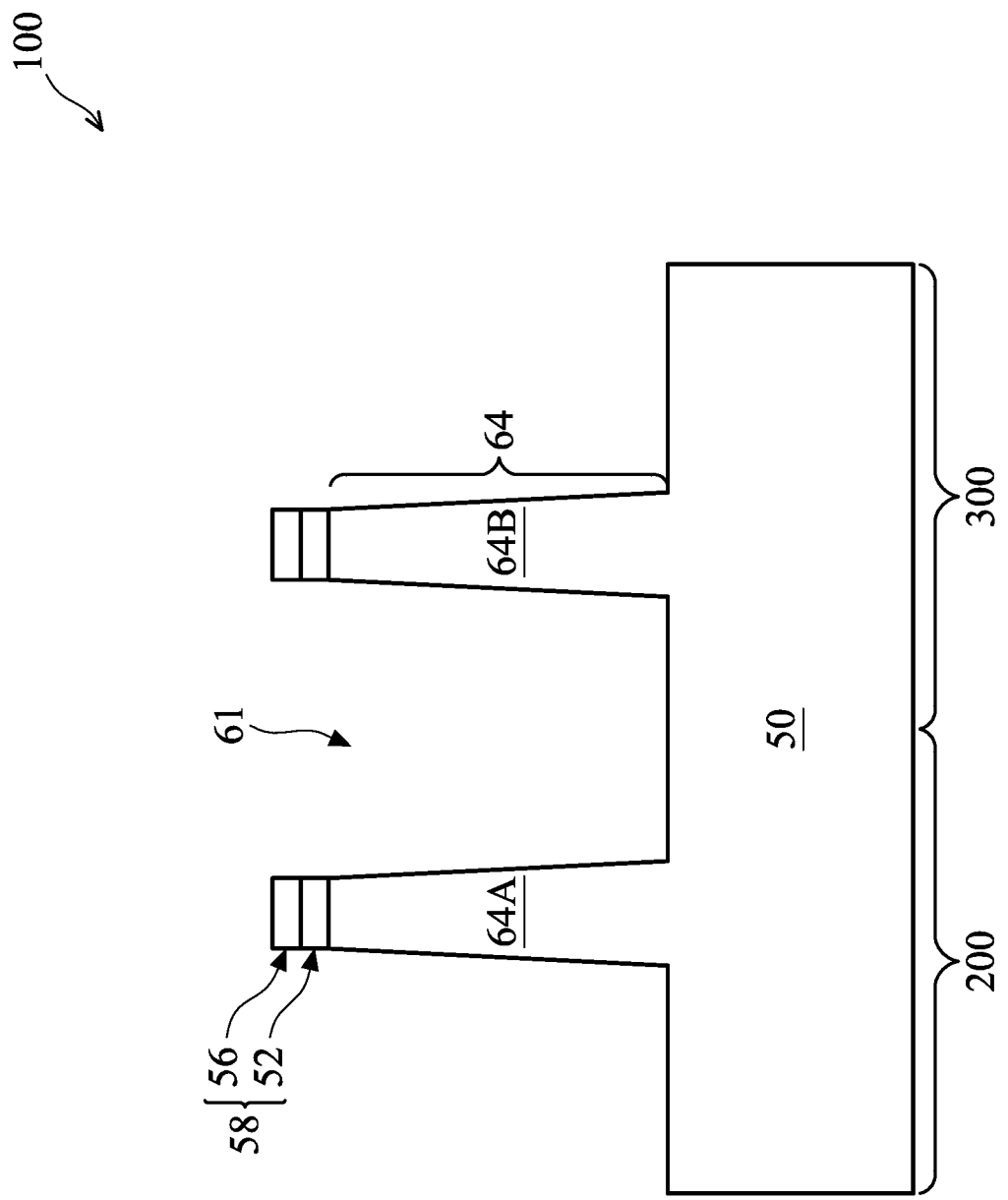

Referring to FIG. 3, the substrate 50 shown in FIG. 2 is patterned using, for example, photolithography and etching techniques. For example, a mask layer, such as a pad oxide layer 52 and an overlying pad nitride layer 56, is formed over the substrate 50. The pad oxide layer 52 may be a thin film comprising silicon oxide formed, for example, using a thermal oxidation process. The pad oxide layer 52 may act as an adhesion layer between the substrate 50 and the overlying pad nitride layer 56 and may act as an etch stop layer for etching the pad nitride layer 56. In some embodiments, the pad nitride layer 56 is formed of silicon nitride, silicon oxynitride, silicon carbide, silicon carbonitride, the like, or a combination thereof, and may be formed using low-pressure chemical vapor deposition (LPCVD) or plasma enhanced chemical vapor deposition (PECVD), as examples.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. In this example, the photoresist material is used to pattern the pad oxide layer 52 and pad nitride 56 to form a patterned mask 58, as illustrated in FIG. 3.

The patterned mask 58 is subsequently used to pattern exposed portions of the substrate 50 to form trenches 61, thereby defining semiconductor fins 64 (e.g., fin 64A in region 200, and fin 64B in region 300) between adjacent trenches 61 as illustrated in FIG. 3. In some embodiments, the semiconductor fins 64 are formed by etching trenches in the substrate 50 using, for example, reactive ion etch (RIE), neutral beam etch (NBE), the like, or a combination thereof. The etch may be anisotropic. In some embodiments, the trenches 61 may be strips (viewed from in the top) parallel to each other, and closely spaced with respect to each other. In some embodiments, the trenches 61 may be continuous and surround the semiconductor fins 64.

The fins 64 may be patterned by any suitable method. For example, the fins may 64 be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 4:
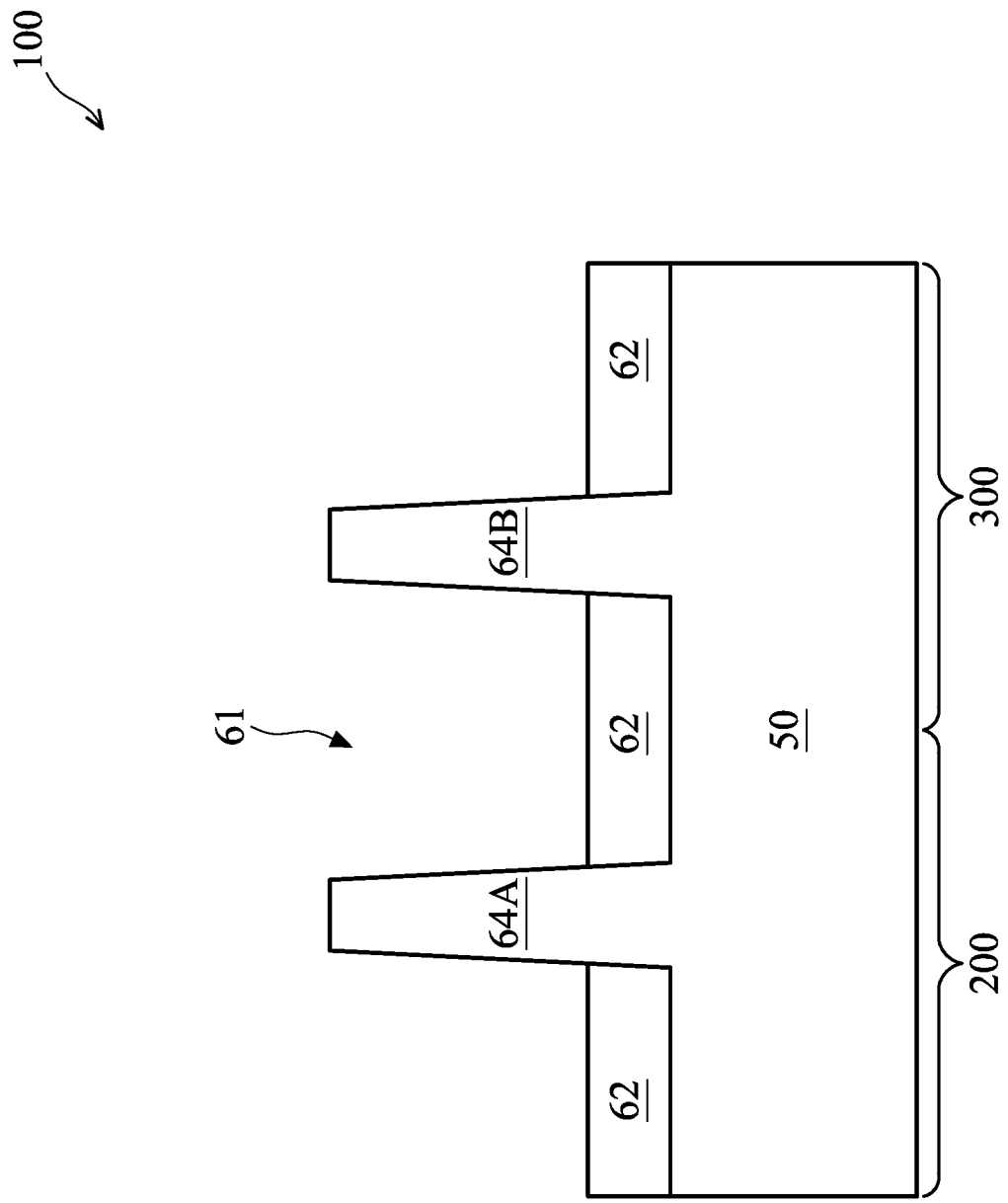

FIG. 4 illustrates the formation of an insulation material between neighboring semiconductor fins 64 to form isolation regions 62. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials and/or other formation processes may be used. In the illustrated embodiment, the insulation material is silicon oxide formed by a FCVD process. An anneal process may be performed once the insulation material is formed. A planarization process, such as a chemical mechanical polish (CMP), may remove any excess insulation material and form top surfaces of the isolation regions 62 and top surfaces of the semiconductor fins 64 that are coplanar (not shown). The patterned mask layer 58 (see FIG. 3) may also be removed by the planarization process.

In some embodiments, the isolation regions 62 include a liner, e.g., a liner oxide (not shown), at the interface between the isolation region 62 and the substrate 50/semiconductor fins 64. In some embodiments, the liner oxide is formed to reduce crystalline defects at the interface between the substrate 50 and the isolation region 62. Similarly, the liner oxide may also be used to reduce crystalline defects at the interface between the semiconductor fins 64 and the isolation region 62. The liner oxide (e.g., silicon oxide) may be a thermal oxide formed through a thermal oxidation of a surface layer of substrate 50, although other suitable method may also be used to form the liner oxide.

Next, the isolation regions 62 are recessed to form shallow trench isolation (STI) regions 62. The isolation regions 62 are recessed such that the upper portions of the semiconductor fins 64 protrude from between neighboring STI regions 62. The top surfaces of the STI regions 62 may have a flat surface (as illustrated), a convex surface, a concave surface (such as dishing), or a combination thereof. The top surfaces of the STI regions 62 may be formed flat, convex, and/or concave by an appropriate etch. The isolation regions 62 may be recessed using an acceptable etching process, such as one that is selective to the material of the isolation regions 62. For example, a chemical oxide removal using a CERTAS® etch or an Applied Materials SICONI tool or dilute hydrofluoric (dHF) acid may be used.

FIGS. 2 through 4 illustrate an embodiment of forming fins 64, but fins may be formed in various different processes. In one example, a dielectric layer can be formed over a top surface of a substrate; trenches can be etched through the dielectric layer; homoepitaxial structures can be epitaxially grown in the trenches; and the dielectric layer can be recessed such that the homoepitaxial structures protrude from the dielectric layer to form fins. In another example, heteroepitaxial structures can be used for the fins. For example, the semiconductor fins can be recessed, and a material different from the semiconductor fins may be epitaxially grown in their place.

In an even further example, a dielectric layer can be formed over a top surface of a substrate; trenches can be etched through the dielectric layer; heteroepitaxial structures can be epitaxially grown in the trenches using a material different from the substrate; and the dielectric layer can be recessed such that the heteroepitaxial structures protrude from the dielectric layer to form fins.

In some embodiments where homoepitaxial or heteroepitaxial structures are epitaxially grown, the grown materials may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fins may comprise silicon germanium (SixGe1-x, where x can be between 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 5:
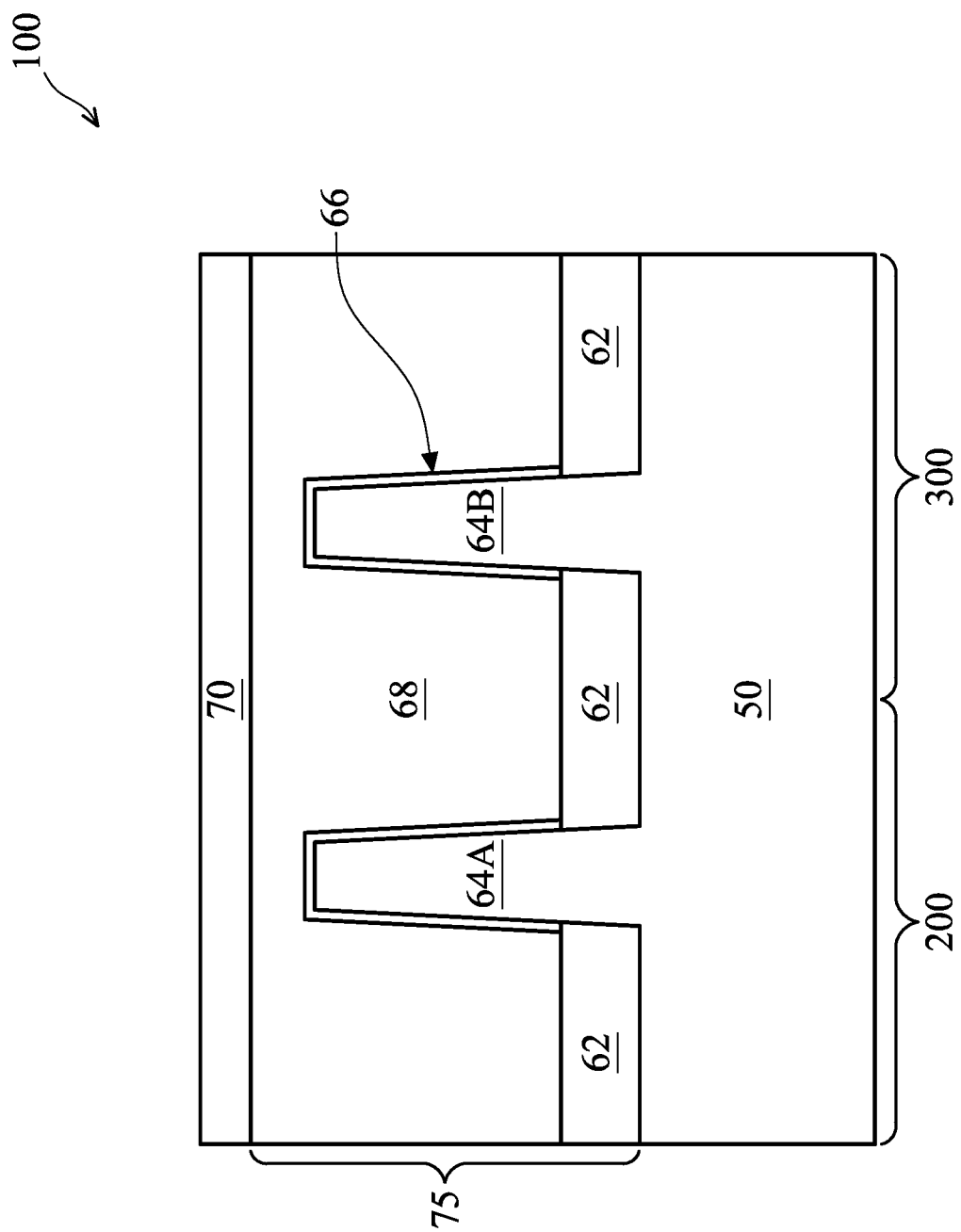

FIG. 5 illustrates the formation of dummy gate structure 75 over the semiconductor fins 64. Dummy gate structure 75 includes gate dielectric 66 and gate 68, in some embodiments. A mask 70 may be formed over the dummy gate structure 75. To form the dummy gate structure 75, a dielectric layer is formed on the semiconductor fins 64. The dielectric layer may be, for example, silicon oxide, silicon nitride, multilayers thereof, or the like, and may be deposited or thermally grown according to acceptable techniques.

A gate layer is formed over the dielectric layer, and a mask layer is formed over the gate layer. The gate layer may be deposited over the dielectric layer and then planarized, such as by a CMP. The mask layer may be deposited over the gate layer. The gate layer may be formed of, for example, polysilicon, although other materials may also be used. In some embodiments, the gate layer may include a metal-containing material such as TiN, TaN, TaC, Co, Ru, Al, combinations thereof, or multi-layers thereof. The mask layer may be formed of, for example, silicon nitride or the like.

After the layers (e.g., the dielectric layer, the gate layer, and the mask layer) are formed, the mask layer may be patterned using acceptable photolithography and etching techniques to form mask 70. The pattern of the mask 70 then may be transferred to the gate layer and the dielectric layer by an acceptable etching technique to form gate 68 and gate dielectric 66, respectively. The gate 68 and the gate dielectric 66 cover respective channel regions of the semiconductor fins 64. The gate 68 may also have a lengthwise direction substantially perpendicular to the lengthwise direction of respective semiconductor fins 64.

The gate dielectric 66 is shown to be formed over the top surfaces and sidewalls of the fins 64 in the example of FIG. 5. In other embodiments, the gate dielectric 66 may be formed over the fins 64 and over the STI regions 62, e.g., the gate dielectric 66 may extends continuously from the fin 64A to the fin 64B. These and other variations are fully intended to be included within the scope of the present disclosure.

FIGS. 6 and 7A illustrate the cross-section views of further processing of the FinFET device 100 along cross-section A-A (along a longitudinal axis of the fin 64). The processing illustrated in FIGS. 6 and 7A are performed for both the region 200 (e.g., a PMOS region) and the region 300 (e.g., an NMOS region), in some embodiments. Therefore, one cross-sectional view along cross-section A-A of the fin 64A or 64B (instead of two cross-sectional views along cross-section A-A of the fin 64A and along cross-section A-A of the fin 64B), is shown in each of FIGS. 6 and 7A.

As illustrated in FIG. 6, lightly doped drain (LDD) regions 65 are formed in the fins 64. The LDD regions 65 may be formed by a plasma doping process. The plasma doping process may include forming and patterning masks such as a photoresist to cover the regions of the FinFET that are to be protected from the plasma doping process. The plasma doping process may implant N-type or P-type impurities in the fins 64 to form the LDD regions 65. For example, P-type impurities, such as boron, may be implanted in the fin 64A to form the LDD regions 65 for a P-type device, and N-type impurities, such as phosphorus, may be implanted in the fin 64B to form the LDD regions 65 for an N-type device. In some embodiments, the LDD regions 65 abut the channel region of the FinFET device 100. Portions of the LDD regions 65 may extend under gate 68 and into the channel region of the FinFET device 100. FIG. 6 illustrates a non-limiting example of the LDD regions 65. Other configurations, shapes, and formation methods of the LDD regions 65 are also possible and are fully intended to be included within the scope of the present disclosure. For example, LDD regions 65 may be formed after first gate spacers 72 are formed.

Still referring to FIG. 6, after the LDD regions 65 are formed, a gate spacer 87 is formed on the gate structure. The gate spacer 87 may include a first gate spacer 72 and a second gate spacer 86. In the example of FIG. 6, the first gate spacer 72 is formed on opposing sidewalls of the gate 68 and on opposing sidewalls of the gate dielectric 66. The second gate spacer 86 is formed on the first gate spacer 72, as illustrated in FIG. 6. The first gate spacer 72 may be formed of a nitride, such as silicon nitride, silicon oxynitride, silicon carbide, silicon carbonitride, the like, or a combination thereof, and may be formed using, e.g., a thermal oxidation, CVD, or other suitable deposition process. The second gate spacer 86 may be formed of silicon nitride, SiCN, a combination thereof, or the like using a suitable deposition method.

In an exemplary embodiment, the gate spacer 87 is formed by first conformally depositing a conformal first gate spacer layer over the FinFET device 100, then conformally depositing a second gate spacer layer over the deposited first gate spacer layer. Next, an anisotropic etch process, such as a dry etch process, is performed to remove a first portion of the second gate spacer layer disposed on upper surfaces of the FinFET device 100 (e.g., the upper surface of the mask 70) while keeping a second portion of the second gate spacer layer disposed along sidewalls of the gate structure. The second portion of the second gate spacer layer remaining after the anisotropic etch process forms the second gate spacer 86. The anisotropic etch process also removes a portion of the first gate spacer layer disposed outside of the sidewalls of the second gate spacer 86, and the remaining portion of the first gate spacer layer forms the first gate spacer 72.

The shapes and formation methods of the first gate spacer 72 and the second gate spacer 86 as illustrated in FIG. 6 are merely non-limiting examples, and other shapes and formation methods are possible. For example, the second gate spacers 86 may be formed after the epitaxial source/drain regions 80 (see FIG. 7A) are formed. These and other variations are fully intended to be included within the scope of the present disclosure.

Next, as illustrated in FIG. 7A, source/drain regions 80 are formed. The source/drain regions 80 are formed by etching the fins 64 to form recesses, and epitaxially growing a material in the recess, using suitable methods such as metal-organic CVD (MOCVD), molecular beam epitaxy (MBE), liquid phase epitaxy (LPE), vapor phase epitaxy (VPE), selective epitaxial growth (SEG), the like, or a combination thereof.

As illustrated in FIG. 7A, the epitaxial source/drain regions 80 may have surfaces raised from respective surfaces of the fins 64 (e.g. raised above the non-recessed portions of the fins 64) and may have facets. The source/drain regions 80 of the adjacent fins 64 may merge to form a continuous epitaxial source/drain region 80 (see FIG. 7C). In some embodiments, the source/drain regions 80 for adjacent fins 64 do not merge together and remain separate source/drain regions 80 (see FIG. 7D). In some embodiments, the resulting FinFET in region 300 (e.g., an NMOS region) is an n-type FinFET, and source/drain regions 80 of the fin 64B comprise silicon carbide (SiC), silicon phosphorous (SiP), phosphorous-doped silicon carbon (SiCP), or the like. In some embodiments, the resulting FinFET in region 200 (e.g., a PMOS region) is a p-type FinFET, and source/drain regions 80 of the fin 64A comprise SiGe, and a p-type impurity such as boron or indium.

The epitaxial source/drain regions 80 may be implanted with dopants to form source/drain regions 80 followed by an anneal process. The implanting process may include forming and patterning masks such as a photoresist to cover the regions of the FinFET that are to be protected from the implanting process. The source/drain regions 80 may have an impurity (e.g., dopant) concentration in a range from about 1E19 cm-3 to about 1E21 cm-3. P-type impurities, such as boron or indium, may be implanted in the source/drain region 80 of a P-type transistor (e.g., in the region 200). N-type impurities, such as phosphorous or arsenide, may be implanted in the source/drain regions 80 of an N-type transistor (e.g., in the region 300). In some embodiments, the epitaxial source/drain regions may be in situ doped during growth.

As illustrated in FIG. 7A, a first interlayer dielectric (ILD) 90 is formed over the source/drain regions 80, the fins 64, and the dummy gate structures 75. In some embodiments, the first ILD 90 is formed of a dielectric material such as phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. A planarization process, such as a CMP process, may be performed to remove the mask 70, and to planarize the top surface of the first ILD 90 such that the top surface of the first ILD 90 is level with the top surface of the gate 68.

FIG. 7B illustrates the cross-sectional view of the FinFET device 100 shown in FIG. 7A, but along cross-section B-B. As illustrated in FIG. 7B, the gate 68 is disposed over the fin 64A and the fin 64B, and extends continuously from the fin 64A in region 200 (e.g., a PMOS region) to the fin 64B in region 300 (e.g., an NMOS region). Although not illustrated in FIG. 7B, the gate spacer 87 (see FIG. 6) may be formed between the gate 68 and the first ILD 90. An embodiment gate-last process (sometimes referred to as replacement gate process) is performed subsequently to replace the gate 68 and the gate dielectric 66 with active gates and active gate dielectric materials. Therefore, the gate 68 and the gate dielectric 66 are considered dummy gate structures in a gate-last process. The embodiment gate-last process, once finished, replaces the dummy gate structure with two gate structures that contact each other. Details of the embodiment gate-last process is described hereinafter with reference to FIGS. 8-21.

FIG. 7C illustrates a cross-sectional view of the FinFET device 100 shown in FIG. 7A, but along cross-section C-C, in accordance with an embodiment. In the example of FIG. 7C, the source/drain regions 80A over the fin 64A merge with the source/drain regions 80B over the fin 64B to form a continuous source/drain region 80 over the fins 64A and 64B. FIG. 7C also illustrates spacers 86' on opposing sidewalls of the source/drain regions 80A/80B, which spacers 86' may be formed of a same material as the material of the second gate spacer 86.

FIG. 7D illustrates a cross-sectional view of the FinFET device 100 shown in FIG. 7A, but along cross-section C-C, in accordance with another embodiment. In the example of FIG. 7D, the source/drain regions 80A over the fin 64A are separate from, thus do not merge with, the source/drain regions 80B over the fin 64B. FIG. 7D also illustrates spacers 86' on opposing sidewalls of the source/drain regions 80A/80B, which spacers 86' may be formed of a same material as the material of the second gate spacer 86.

Figure 8:
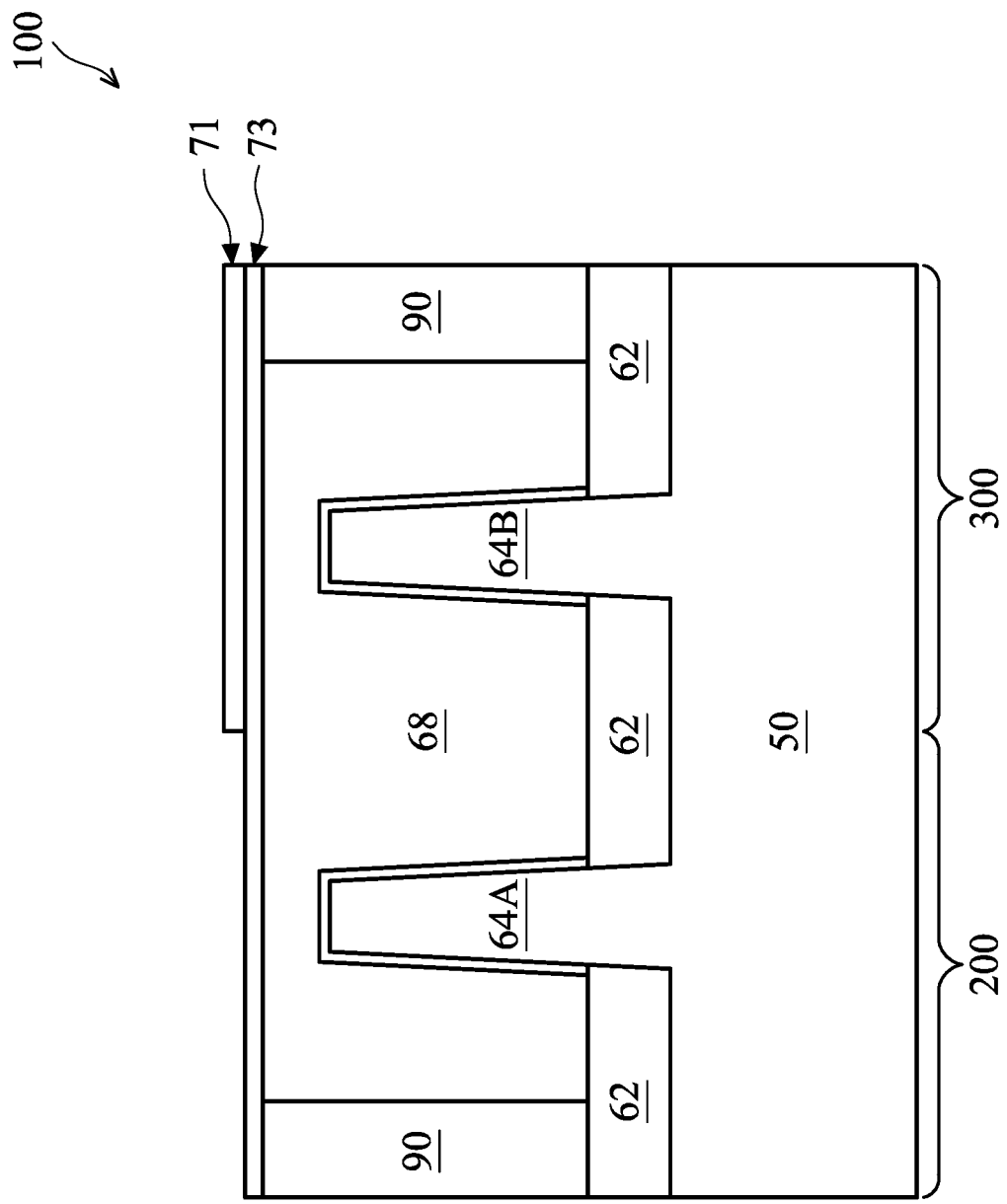

FIGS. 8-21 illustrates cross-sectional views of the FinFET device 100 along cross-section B-B during further processing, in accordance with some embodiments. Referring to FIG. 8, a hard mask layer 73 is formed over the gate 68 and the first ILD 90. The hard mask layer 73 may comprise silicon oxide, silicon nitride, silicon carbon nitride, or the like, and may be formed by physical vapor deposition (PVD), chemical vapor deposition (CVD), atomic layer deposition (ALD), or other suitable deposition method. Next, a photo sensitive layer 71, such as a photoresist, is formed over the hard mask layer 73. The photo sensitive layer 71 is then patterned, e.g., using photolithography and/or etching techniques, to expose a portion of the hard mask layer 73 over the region 200 while covering a portion of the hard mask layer 73 over the region 300, as illustrated in FIG. 8.

Figure 9:
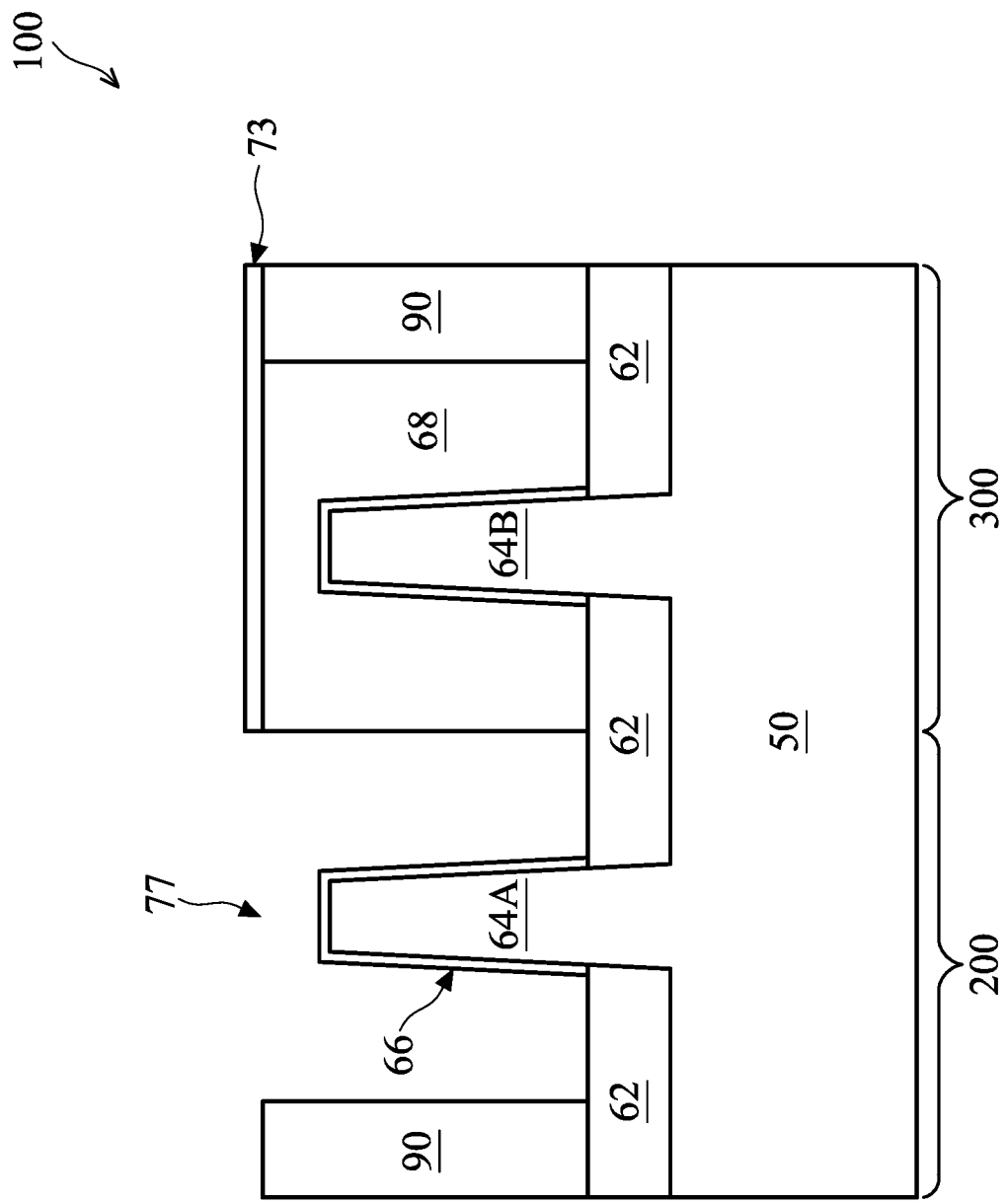

Next, in FIG. 9, the patterns of the patterned photo sensitive layer 71 is transferred to the hard mask layer 73 using a suitable process such as an anisotropic etching process. The photo sensitive layer 71 is then removed using, e.g., an ashing process or any suitable removal process. The patterned hard mask layer 73 is used to shield a portion of the dummy gate structures (e.g., the gate 68 and the gate dielectric 66) in the region 300 from a subsequent etching process.

Next, a portion of the gate 68 in the region 200 is removed to form a recess 77, which recess 77 exposes the gate dielectric 66 and the fin 64A. In some embodiments, the gate 68 in the region 200 is removed by an anisotropic etching process such as a plasma etching process. In an exemplary embodiment, the anisotropic etching process (e.g., a plasma etching process) is performed as a two-step process that includes a first etching step using a first etching gas, followed by a second etching step using a second etching gas different from the first etching gas. For example, the first etching step may be performed using the first etching gas comprising HBr and $NF_3$, and the second etching step may be performed using the second etching gas comprising $Cl_2$ and $O_2$. The first etching allows for control of the vertical profile of the recess 77 and better control of the critical dimension (CD) of the FinFET device 100, and the second etching process offers etching selectivity between the material of the gate 68 and the material(s) of the underlying layer(s) of the gate 68, in some embodiments.

In some embodiments, during the first etching step, a flow rate of HBr is in a range from about 100 standard cubic centimeter per minute (sccm) to about 1000 sccm, and a flow rate of $NF_3$ is in a range from about 100 sccm to about 1000 sccm. A temperature of the first etching step is in a range from about 20° C. to about 100° C. The first etching step may be performed to remove the upper half of the gate 68 in the region 200, and the second etching step may then be performed to remove the remaining lower half of the gate 68 in the region 200.

In some embodiments, during the second etching step, a flow rate of Cl$_2$ is in a range from about 100 sccm to about 1000 sccm, and a flow rate of O$_2$ is in a range from about 100 sccm to about 1000 sccm. A temperature of the second etching step is in a range from about 20° C. to about 100° C. As illustrated in FIG. 9, the gate 68 in the region 200 is removed after the second etching step, and the recess 77 exposes the STI regions 62 and the gate dielectric 66 over the fin 64A.

Figure 10:
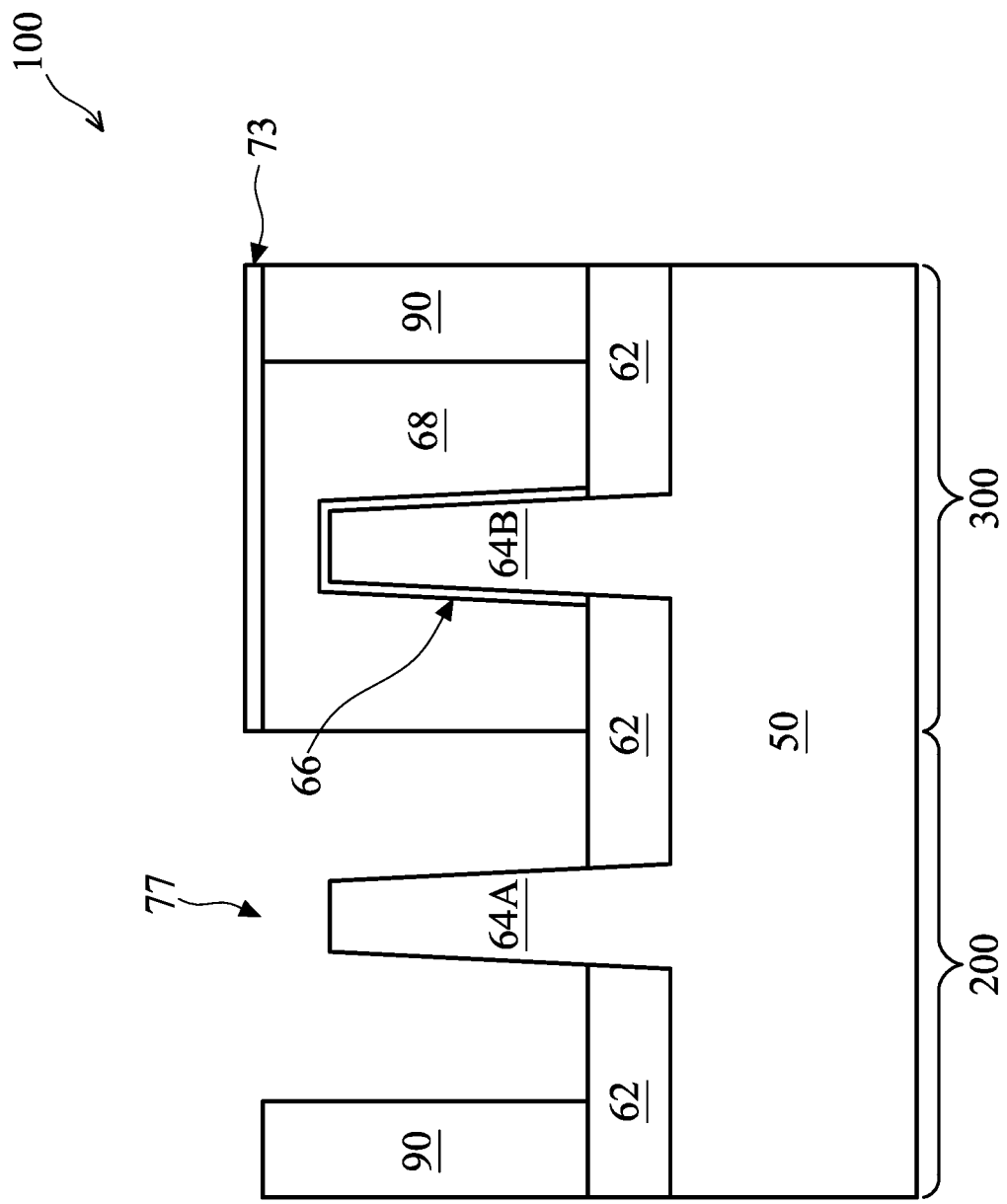

Referring to FIG. 10, the gate dielectric 66 (e.g., silicon oxide) over the fin 64A is removed using, e.g., dry etch, wet etch, or any suitable removal process. In some embodiments, the gate dielectric 66 over the fin 64A is removed by a chemical etching process using HF as the etchant. As illustrated in FIG. 10, an upper surface and sidewalls of the fin 64A are exposed by the recess 77.

Figure 11:
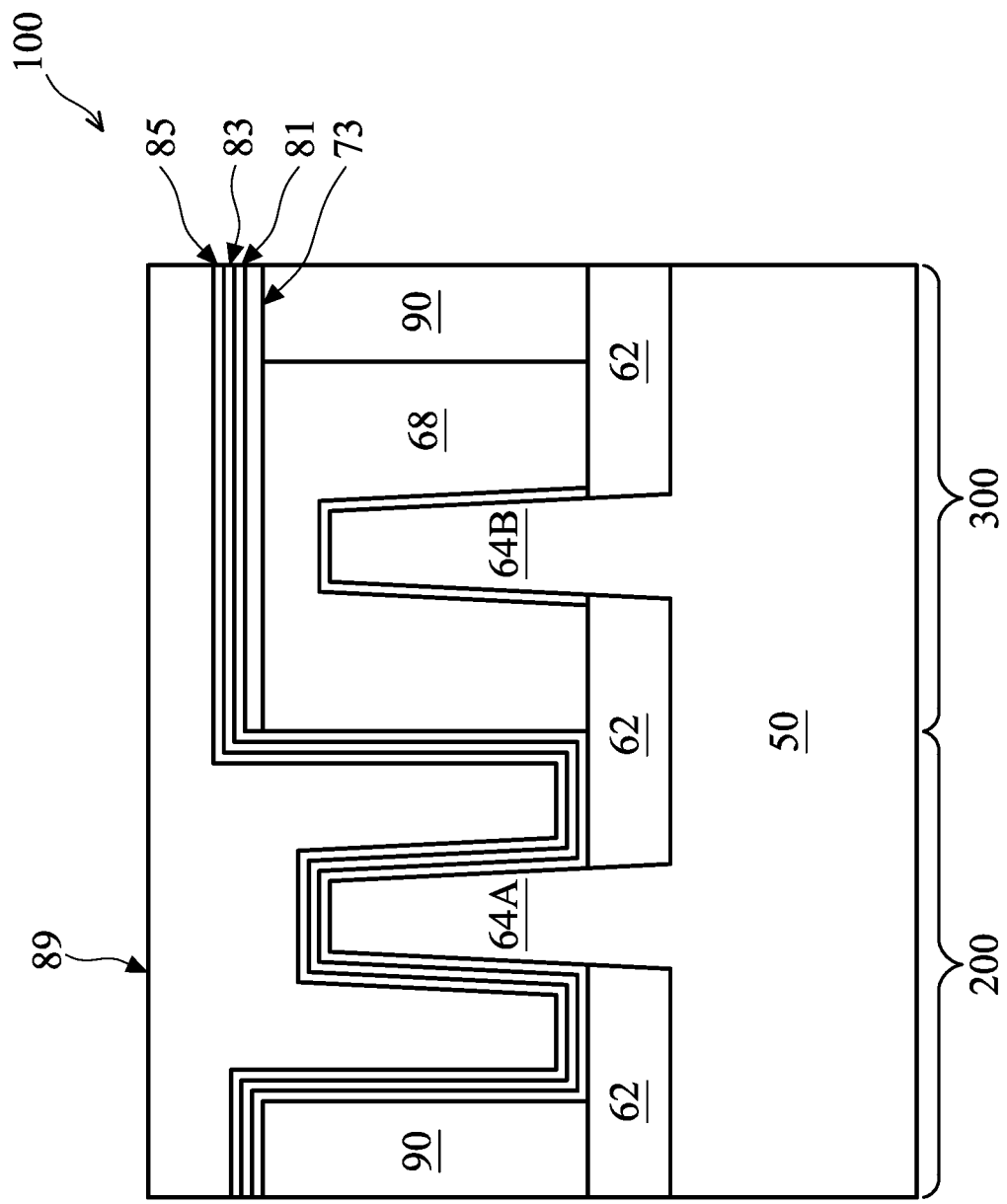

Referring next to FIG. 11, a gate dielectric material 81 is conformally formed in the recess 77, over the upper surface of the first ILD 90, and over the upper surface of the hard mask layer 73. As illustrated in FIG. 11, the gate dielectric material 81 lines the bottom and sidewalls of the recess 77 (see FIG. 10). The gate dielectric material 81 also lines the upper surface and the sidewalls of the fin 64, and the upper surface of the STI region 62. The gate dielectric material 81 may include silicon dioxide. The silicon oxide may be formed by suitable oxidation and/or deposition methods. In some embodiments, the gate dielectric material 81 includes a high-k dielectric layer such as hafnium oxide (HfO$_2$). Alternatively, the high-k dielectric layer may optionally include other high-k dielectrics, such as TiO$_2$, HfZrO, Ta$_2$O$_3$, HfSiO$_4$, ZrO$_2$, ZrSiO$_2$, combinations thereof, or other suitable material. The high-k dielectric layer may be formed by ALD, PVD, CVD, or other suitable methods.

As illustrated in FIG. 11, a capping layer 83 is conformally formed over the gate dielectric material 81. The capping layer 83 may act as a protection layer for the gate dielectric material 81. In some embodiments, the capping layer 83 comprises TiN, TiSiN, TaN, LaO, TiAl, TaAl, TiAlC, or TaAlC, and is formed by ALD, PVD, CVD, or other suitable methods.

Next, a barrier layer 85 is conformally formed over the capping layer 83. The barrier layer 85 may prevent or reduce the out diffusion of the material of a subsequently formed gate electrode (see, e.g., 88A and 88B in FIG. 19). The barrier layer 85 may also function as an etch stop layer to control a subsequent etching process. The barrier layer 85 may comprise a conductive material such as titanium nitride, although other materials, such as tantalum nitride, titanium, tantalum, or the like may alternatively be utilized. The barrier layer 85 may be formed using a CVD process, such as plasma-enhanced CVD (PECVD). However, other alternative processes, such as sputtering or metal organic chemical vapor deposition (MOCVD), ALD, may alternatively be used. In an exemplary embodiment, the capping layer 83 comprises titanium nitride (TiN), and the barrier layer 85 comprises tantalum nitride (TaN).

Next, a sacrificial material 89 is formed in the recess 77 and over the barrier layer 85. The sacrificial material 89 may fill and overfill the recess 77, as illustrated in FIG. 11. The sacrificial material 89 may be any suitable material that provides an etch selectivity over its underlying layer (e.g., barrier layer 85), and that may be removed easily by an etching process. In some embodiments, the sacrificial material 89 comprise a metal. In an exemplary embodiment, the sacrificial material 89 comprises an alloy, such as an alloy of aluminum and copper (e.g., AlCu), and is formed by PVD, CVD, plating, or any suitable deposition method. Besides AlCu, other suitable material, such as tungsten (W), or an organic bottom anti-reflective coating (BARC) material, may also be used for the sacrificial material 89.

Figure 12:
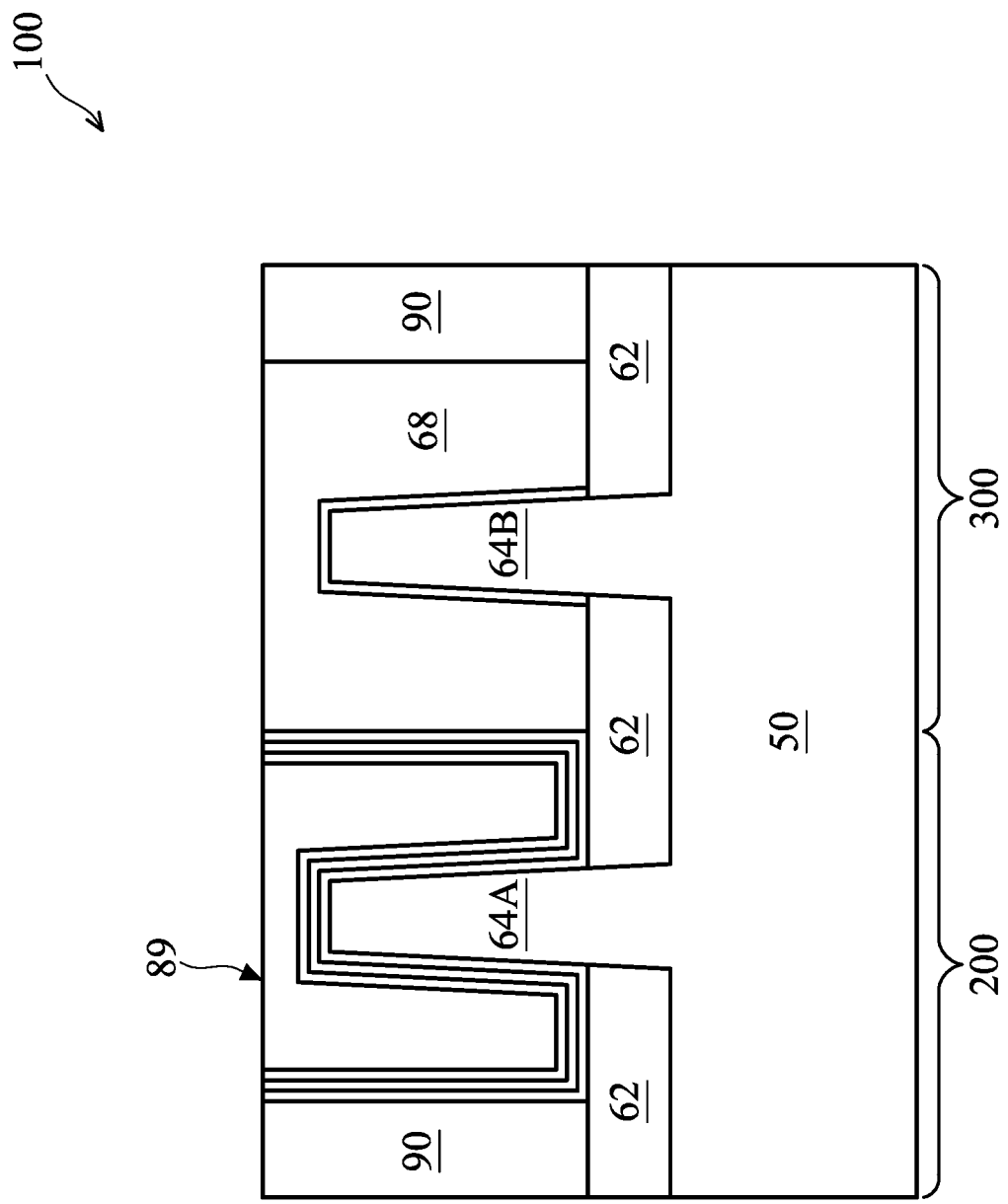

Next, in FIG. 12, a planarization process, such as CMP, is performed to remove excess portions of the sacrificial material 89 outside of the recess 77. The planarization process also removes the hard mask layer 73, and portions of the gate dielectric material 81/capping layer 83/barrier layer 85 over the upper surface of the first ILD 90 (e.g., in the region 300). After the planarization process, the gate 68 over the fin 64B in the region 300 is exposed. In the illustrated example of FIG. 12, portions of the gate dielectric material 81/capping layer 83/barrier layer 85 over the upper surface of the first ILD 90 in the first region 200 remain after the planarization process, because the upper surface of the ILD 90 in the region 200 is lower than the upper surface of the ILD 90 in the region 300 at this stage of processing.

Figure 13:
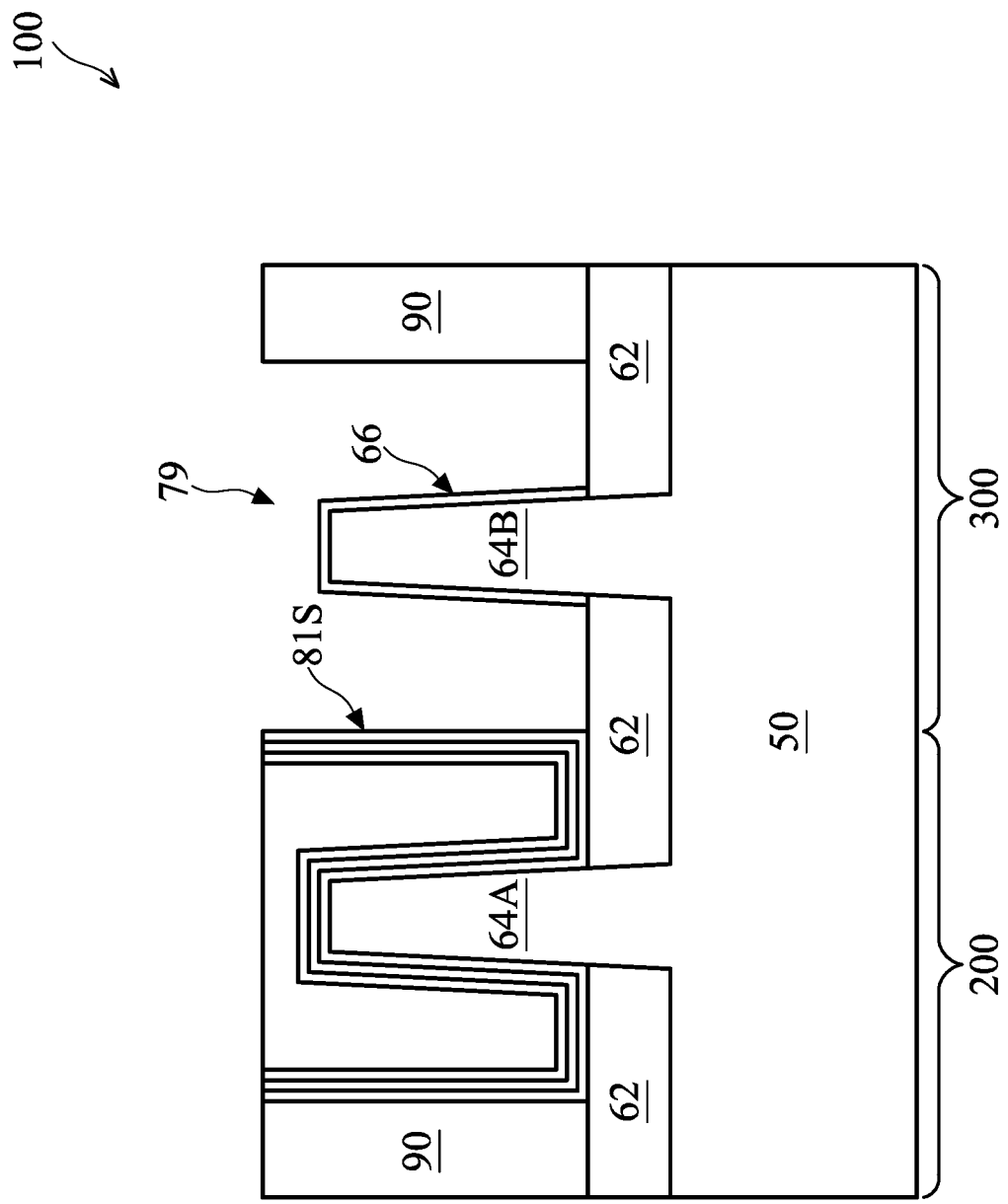

Referring now to FIG. 13, the portion of the gate 68 over the fin 64B (e.g., the portion of the gate 68 in the region 300) is removed. In some embodiments, an isotropic etching process is performed to remove the gate 68. In an exemplary embodiment, an etchant of the isotropic etching process is selective to the material of the gate 68 (e.g., having a higher etching rate for the material of the gate 68 than other exposed materials), thus no mask is needed to cover the features formed in the region 200 during the isotropic etching process. For example, a wet etch using NH$_4$OH may be performed to remove the gate 68. Other suitable etching process, such as a dry etch, may also be used. After the removal of the portion of the gate 68 over the fin 64B in FIG. 13, a recess 79 is formed, which recess 79 exposes a sidewall portion 81S of the gate dielectric material 81 and the gate dielectric 66 on the fin 64B, which sidewall portion 81S was in contact with a sidewall of the portion of the gate 68 over the fin 64B before that portion of the gate 68 was removed.

Figure 14:
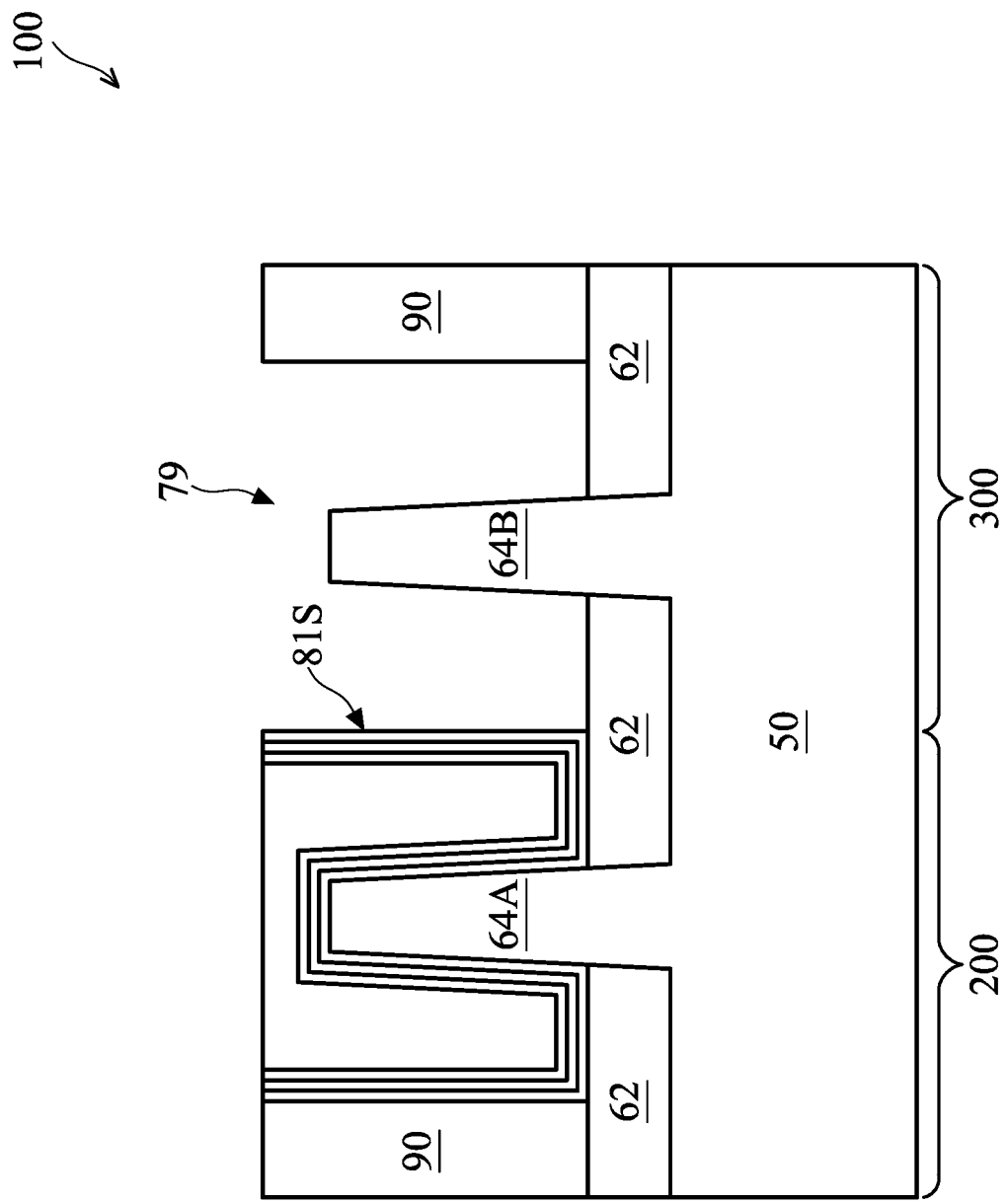

Next, in FIG. 14, the gate dielectric 66 over the fin 64B is removed, e.g., using dry etch, wet etch, or any suitable removal process. In some embodiments, the gate dielectric 66 over the fin 64B is removed by a chemical etching process using HF as the etchant. As illustrated in FIG. 14, an upper surface and sidewalls of the fin 64B are exposed by the recess 79.

Figure 15:
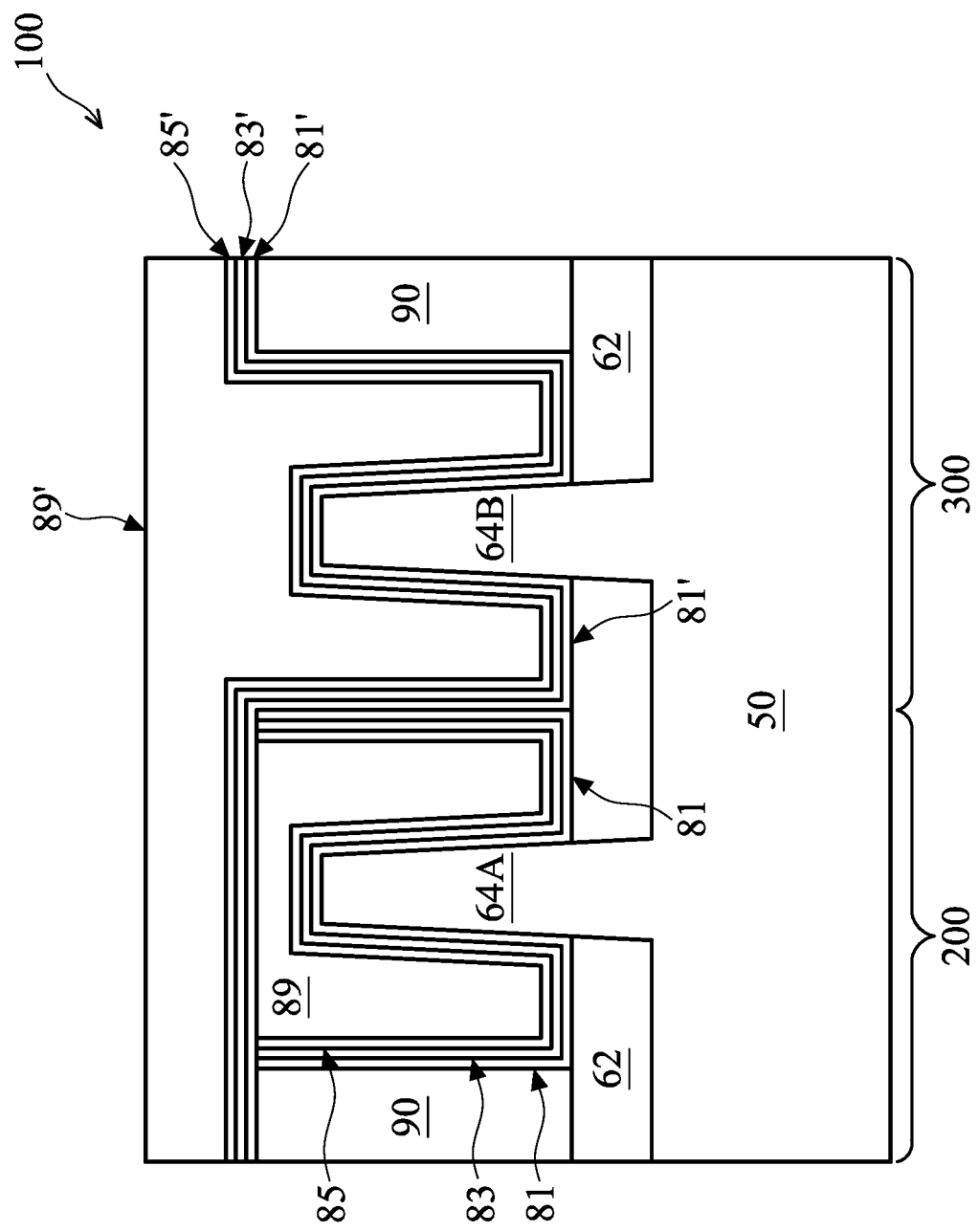

In FIG. 15, a gate dielectric material 81', a capping layer 83', and a barrier 85' are formed successively over the FinFET device 100 shown in FIG. 14, and a sacrificial material 89' is formed to fill and overfill the recess 79. As illustrated in FIG. 15, the gate dielectric material 81', the capping layer 83', and the barrier 85' are conformal to their respective underlying layer(s). The materials and the formation methods for the gate dielectric material 81', the capping layer 83', the barrier layer 85', and the sacrificial material 89' may be similar to those of the gate dielectric material 81, the capping layer 83, the barrier layer 85, and the sacrificial material 89, respectively, although in some embodiments, the material(s) of certain layer(s) (e.g., the gate dielectric material 81') may be adjusted for the type of devices (e.g., N-type devices) to be formed in the region 300, and thus, may be different from the corresponding material(s) in the region 200.

As illustrated in FIG. 15, the gate dielectric material 81' physically contacts and extends along the sidewall portion 81S (see FIG. 14) of the gate dielectric material 81. Therefore, at the boundary between the region 200 and the region 300, the gate dielectric material 81 and the gate dielectric material 81' form an insulation region, which insulation region separates the subsequently formed gate electrode 88A (see FIG. 19) from the subsequently formed gate electrode 88B (see FIG. 19). In embodiments where the gate dielectric material 81 and the gate dielectric material 81' comprise a same material (e.g., a same high-K dielectric material), the same material extends continuously from the fin 64A to the fin 64B.

Since the gate dielectric material 81'/capping layer 83'/barrier layer 85' are conformally formed over the upper surface of the sacrificial material 89, the sacrificial material 89 is surrounded by a combination of the layer stack 81/83/85 and the layer stack 81'/83'/85'. For example, the sacrificial material 89 is disposed between the layer stack 81/83/85 and the layer stack 81'/83'/85' along the horizontal direction and along the vertical direction, as illustrated in FIG. 15.

Figure 16:
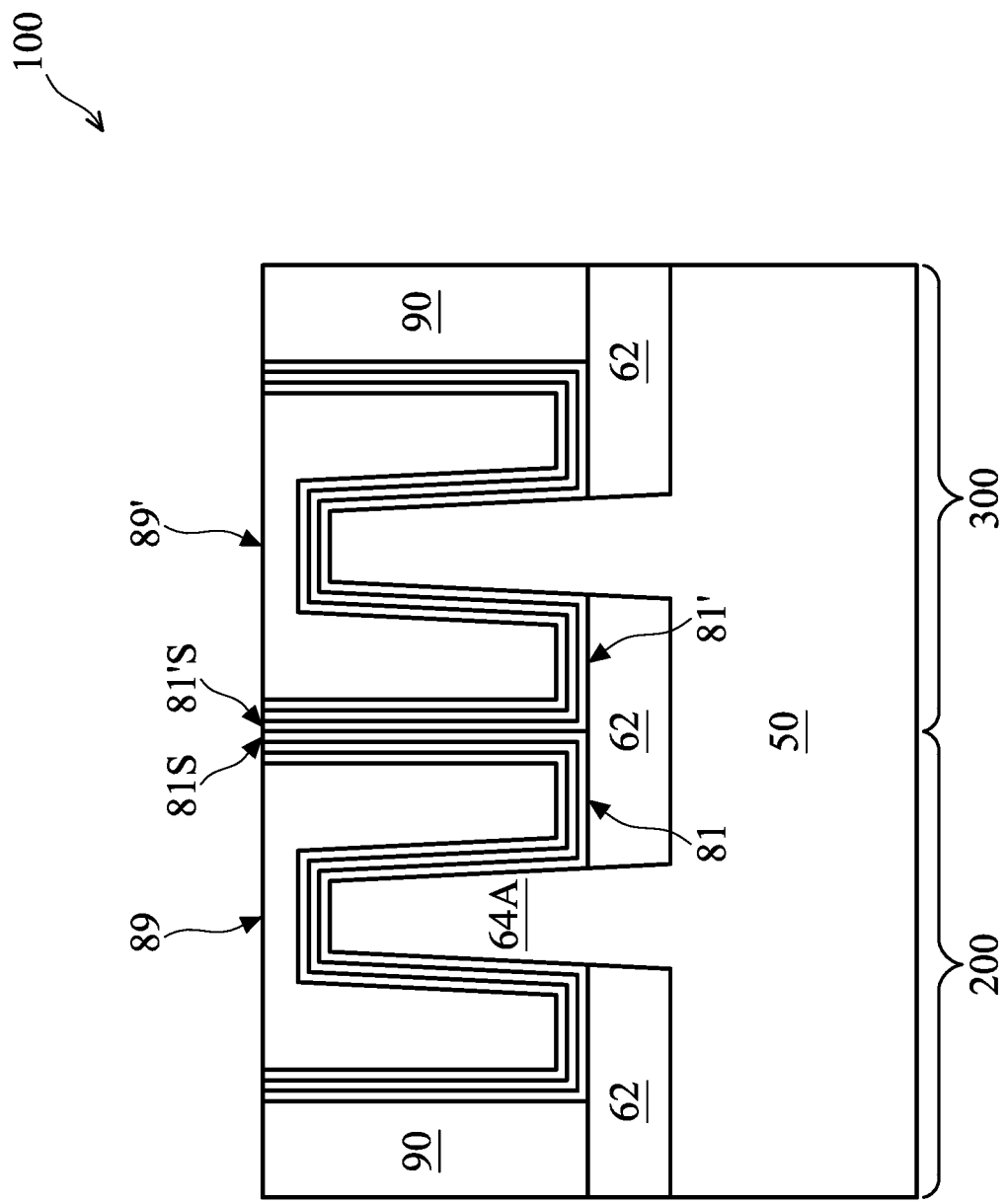

Next, as illustrated in FIG. 16, a planarization process, such as CMP, is performed to remove portions of the deposited layers (e.g., 81/83/85, 89, 81'/83'/85', and 89') that are over the upper surface of the first ILD 90. After the planarization process, the sacrificial material 89, the sacrificial material 89', and the first ILD 90 have a coplanar upper surface. As shown in FIG. 16, a sidewall portion 81'S of the gate dielectric material 81' extends along and contacts the sidewall portion 81S of the gate dielectric material 81.

Figure 17:
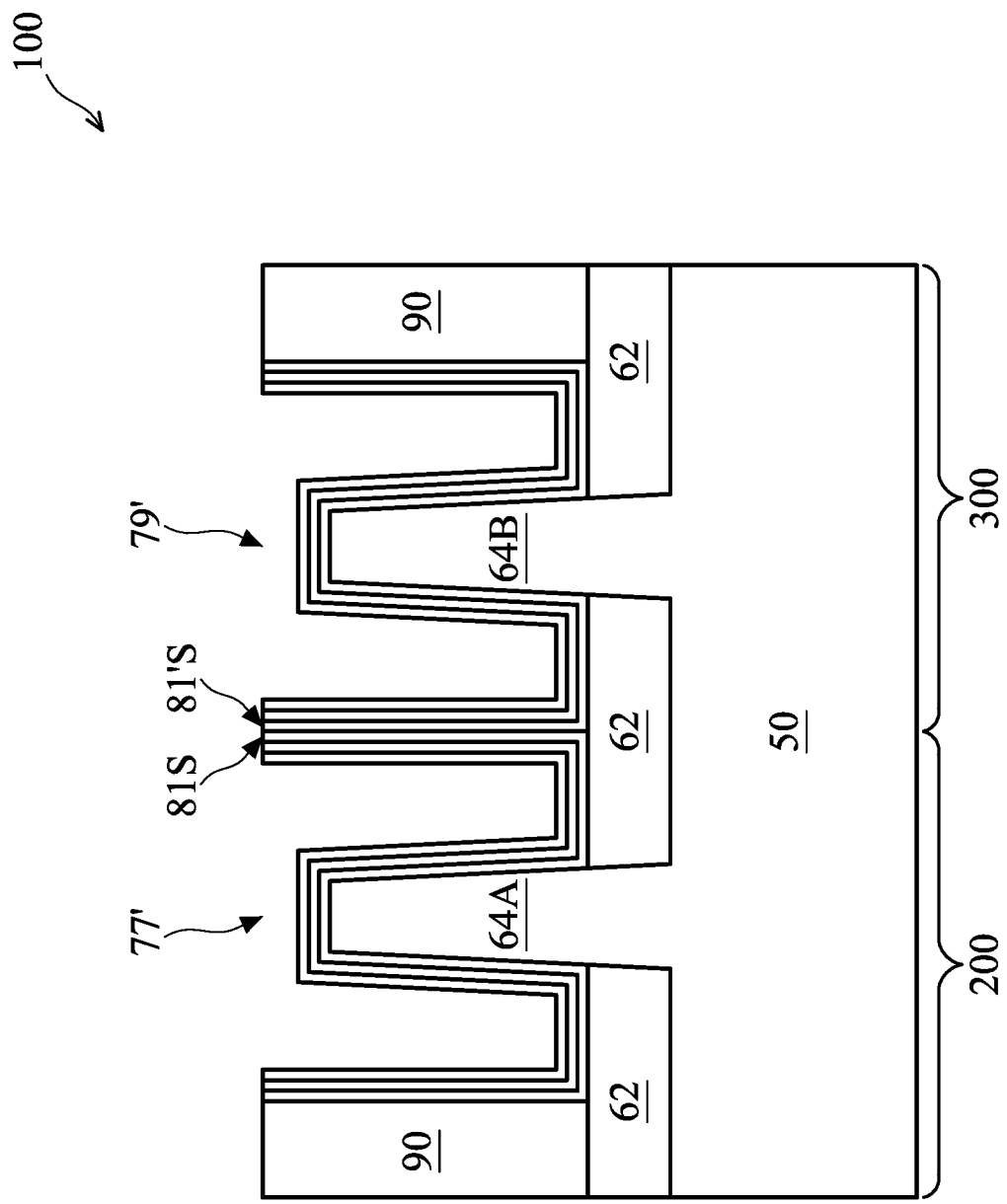

Referring to FIG. 17, the sacrificial materials 89 and 89' are removed to form recesses 77' and 79'. An isotropic etching process, such as a wet clean, is performed to remove the sacrificial materials 89 and 89', in some embodiments. The isotropic etching process may selectively remove the sacrificial materials 89 and 89'. For example, a wet clean using hydrofluoric acid (HF), diluted tris-borate-ethylene diamine tetraacetic acid (TBE), or other suitable etchant may be performed to remove the sacrificial materials 89 and 89'.

Figure 18:
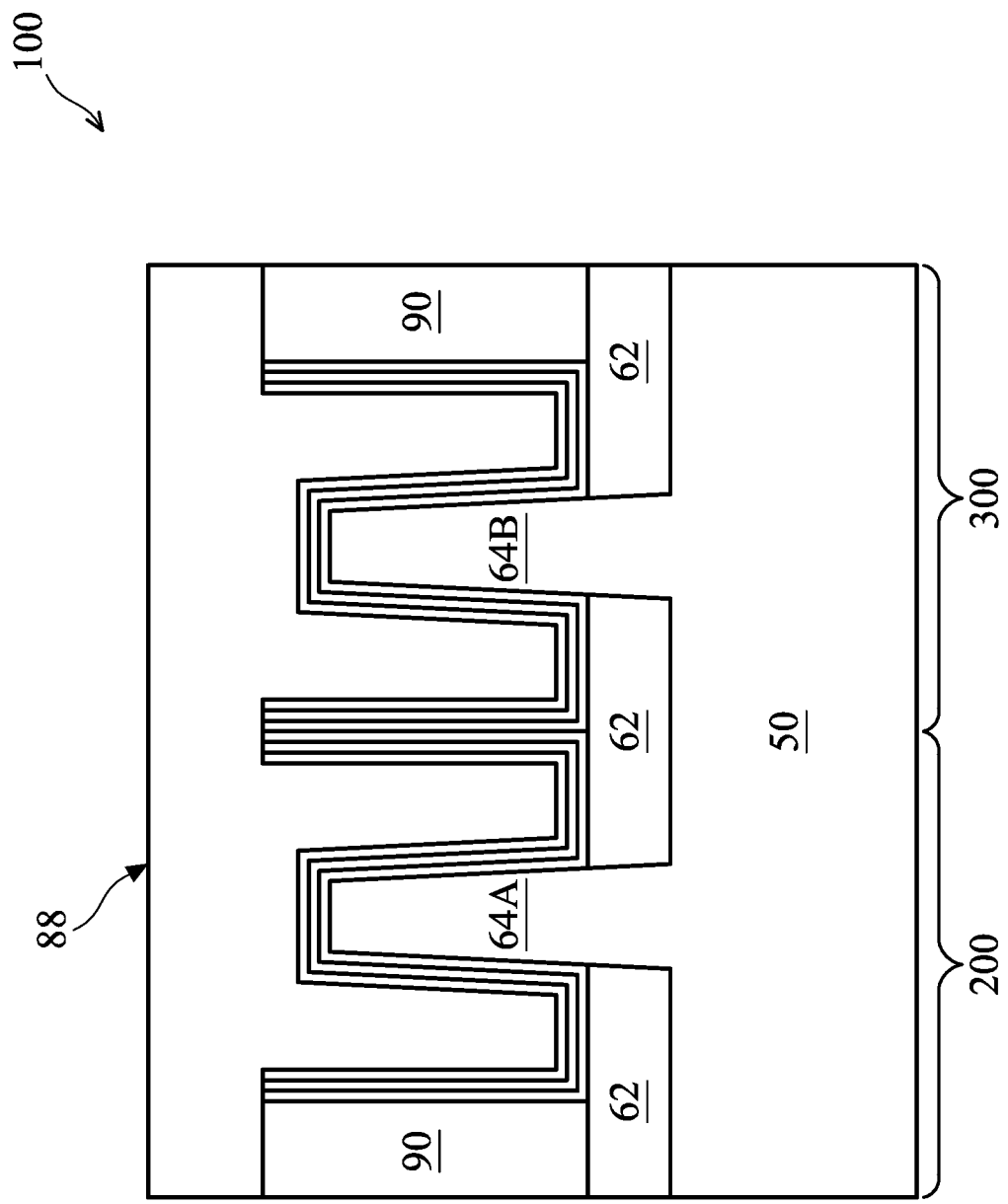

Next, as illustrated in FIG. 18, a conductive material 88 is formed to fill the recesses 77' and 79' to form the gate structures of the FinFET device 100. The conductive material 88 may be formed onto a seed layer (not shown) over the barrier layers 85/85'. The seed layer may include copper (Cu), titanium (Ti), tantalum (Ta), titanium nitride (TiN), tantalum nitride (TaN), the like, or a combination thereof, and may be deposited by atomic layer deposition (ALD), sputtering, physical vapor deposition (PVD), or the like. The conductive material 88 may comprise tungsten, although other suitable materials such as aluminum, copper, rhuthenium, silver, gold, rhodium, molybdenum, nickel, cobalt, cadmium, zinc, alloys of these, combinations thereof, and the like, may alternatively be utilized. The conductive material 88 may be formed by electroplating, PVD, CVD, or any suitable deposition method.

Although not illustrated in FIG. 18, different work function layers such as P-type work function layers and N-type work function layers may be formed in the recesses 77' and 79', respectively, over the barrier layers 85/85' and before the conductive material 88 is formed, in some embodiments. Patterned mask layer(s) may be formed to shield one region (e.g., region 300) while the work function layer for another region (e.g., region 200) is being formed. Exemplary p-type work function metals that may be included in the gate structure include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals that may be included in the gate structure include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the work function layer is chosen to tune its work function value so that a target threshold voltage Vt is achieved in the device that is to be formed in the respective region (e.g., the regions 200 and 300). The work function layer(s) may be deposited by CVD, physical vapor deposition (PVD), and/or other suitable process.

Figure 19:
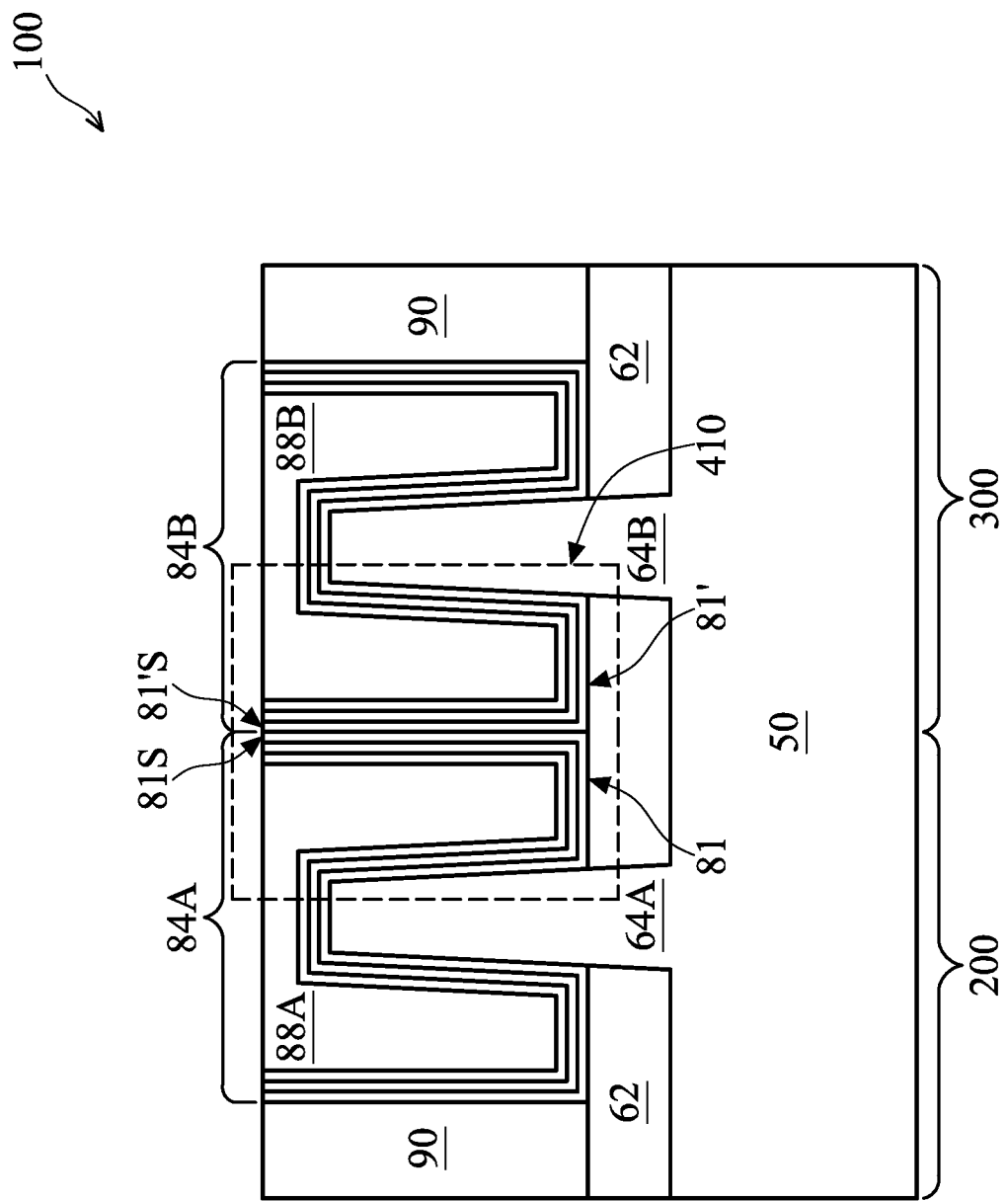

Next, in FIG. 19, a planarization process, such as CMP, is performed to remove portions of the conductive material 88 over the upper surface of the first ILD 90. After the planarization process, gate electrodes 88A and 88B are formed in the region 200 and the region 300, respectively. The layer stack 81/83/85 and the gate electrode 88A therefore form a gate structure 84A in the region 200, and the layer stack 81'/83'/85' and the gate electrode 88B therefore form a gate structure 84B in the region 300. In some embodiments, the gate structure 84A is the gate structure of a P-type FinFET transistor, and the gate structure 84B is the gate structure of an N-type transistor. The gate structure 84A contacts the gate structure 84B, as illustrated in FIG. 19. In particular, the gate dielectric material 81 (e.g., the sidewall portion 81S) of the gate structure 84A contacts the gate dielectric material 81' (e.g., the sidewall portion 81'S) of the gate structure 84B. As illustrated in FIG. 19, the gate structure 84A and the gate structure 84B are insulated from each other by the gate dielectric materials 81 and 81'. The gate structure 84A and 84B may be controlled independently by two voltages, e.g., a first voltage and a second voltage which may be different from the first voltage, in some embodiments.

As illustrated in FIG. 19, the sidewall portion 81S of the gate dielectric material 81 extends along a sidewall of the gate electrode 88A. Similarly, the sidewall portion 81'S of the gate dielectric material 81' extends along a sidewall of the gate electrode 88B. The sidewall portion 81S and the sidewall portion 81'S have a same height measured along a direction of the sidewalls of the gate electrodes 88A and 88B, e.g., along a direction perpendicular to an upper surface of the STI region 62. The sidewall portion 81S and the sidewall portion 81'S form an insulation region that insulates the gate electrode 88A from the gate electrode 88B. In the illustrated example of FIG. 19, the insulation region is substantially perpendicular to portions of the gate dielectric materials 81 and 81' that extend along the upper surface of the STI region 62.

Figure 20:
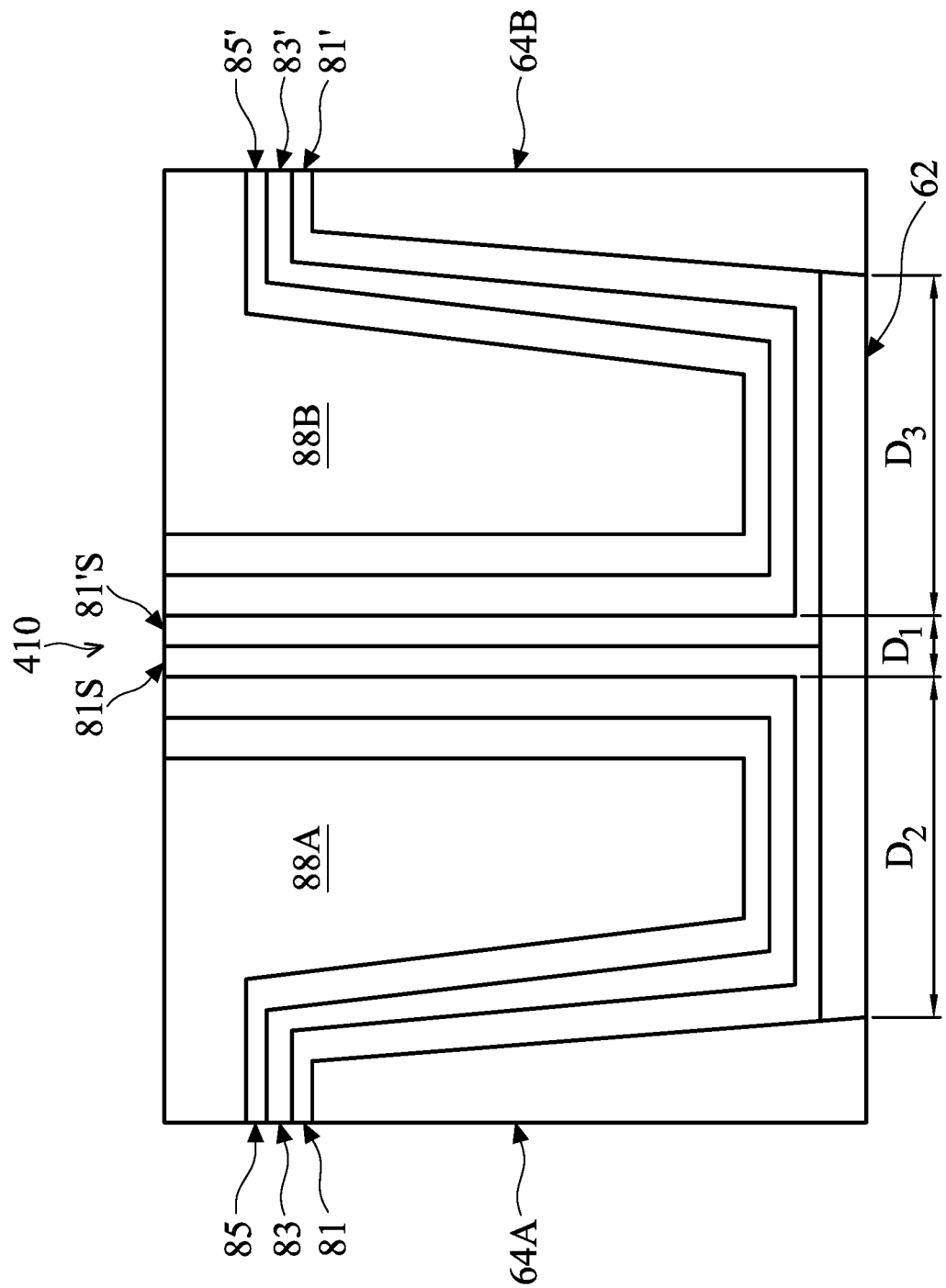

FIG. 20 shows a zoomed-in view of an area 410 of FIG. 19. As illustrated in FIG. 20, the gate dielectric materials 81 and 81' form an insulation region between the gate structures 84A and 84B. In the example of FIG. 20, a thickness $D_1$ of the insulation region, which is equal to a sum of the thicknesses of the gate dielectric materials 81 and 81', is between about 1.5 nm and about 6 nm, such as about 3 nm. A distance $D_2$ from the fin 64A to the insulation region is in a range from about 10 nm to about 30 nm, such as about 21.5 nm, and a distance $D_3$ from the fin 64B to the insulation region is in a range from about 10 nm to about 30 nm, such as about 21.5 nm. Therefore, by insulating the gate structures 84A and 84B using the gate dielectric materials 81 and 81', the present disclosure achieves a small fin-to-fin pitch of, e.g., about 46 nm, which was not achieved previously using existing manufacturing processing.

The small fin-to-fin pitch of the present disclosure allows for high integration density and reduced device cost. The presently disclosed embodiment forms the insulation region (e.g., portions of the gate dielectric materials 81 and 81') between gate structures 84A and 84B in a self-aligned manner, there is no need to form a cut pattern to cut a gate structure that straddles the fins 64A/64B into two separate gate structures. As the sizes of the cut patterns shrink in advanced process technology and approach the limit of photolithography techniques, it is increasingly difficulty to accurately transfer the patterns of the photo mask to the underlying photoresist. An improperly transferred cut pattern may cause bridge issue (e.g., electrical short) and results in device failure. In addition, the minimum size of the cut patterns may be limited by the photolithography techniques, and the distance between the fins 64A and 64B may have to be made large to accommodate the size of the cut pattern. For example, the cut pattern may have a size of 20 nm, which is much larger than the 3 nm insulation region achieved by the present disclosure. Therefore, the present disclosure allows for a higher integration densities not achieved by the previous processing methods.

In addition, since there is no need to form a cut pattern then fill the cut pattern with dielectric material for insulation between gate structures, the difficulty with filling high aspect ratio holes (e.g., the cut pattern) is avoided. Furthermore, in processes where a metal gate is formed first then cut into two separate gates, the etching process used in the cutting process may leave residues and/or may damage the metal gates. The presently disclosed method avoids the metal gate cutting process, thus avoiding the damage to the metal gates and achieving better performance (e.g., smaller leakage current) for the semiconductor device formed.

Figure 21:
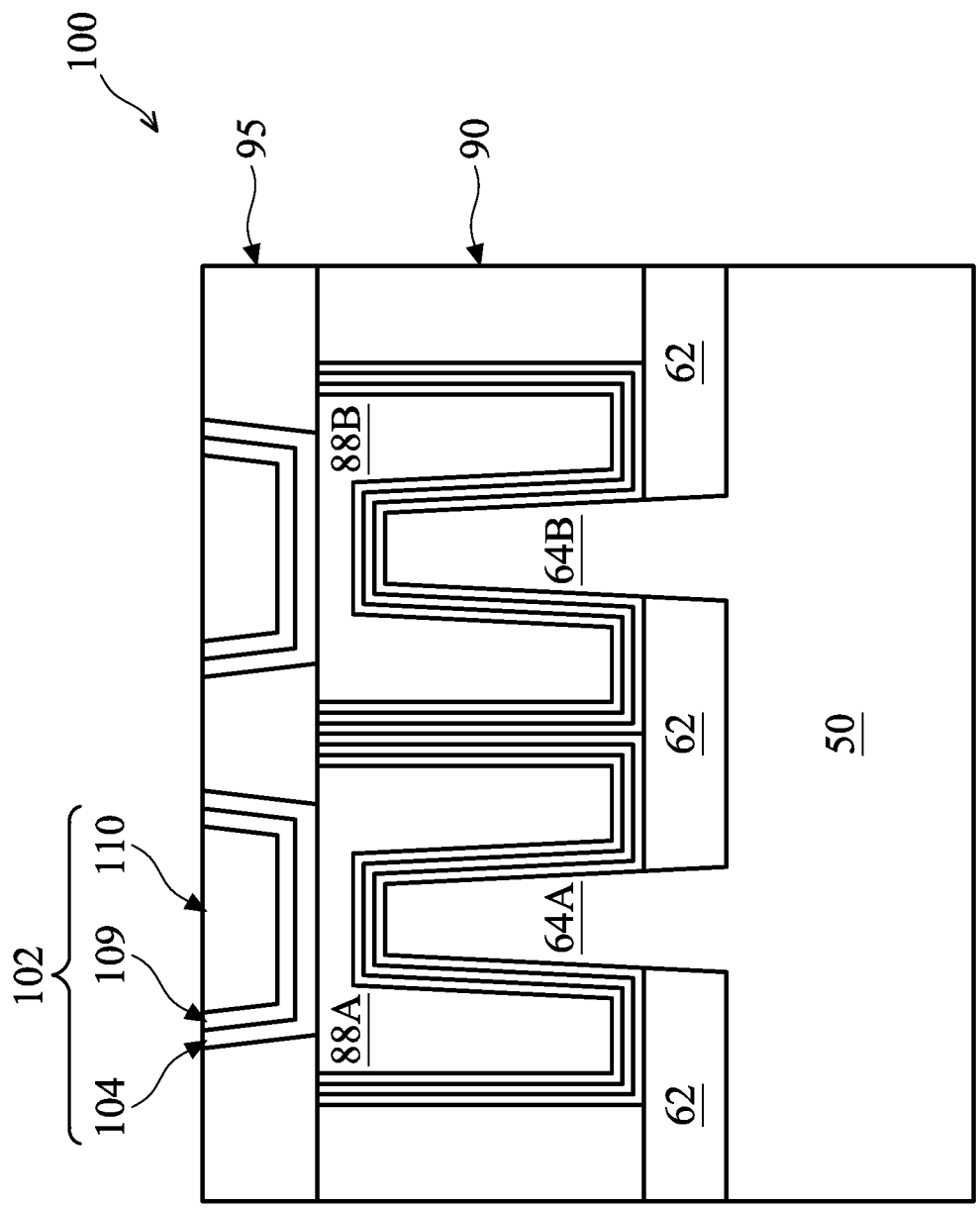

FIG. 21 illustrates additional processing following the step shown in FIGS. 19 and 20. In FIG. 21, a second ILD 95 is formed over the first ILD 90. Contact openings are formed through the second ILD 95 to expose the gate structure 84A and 84B. Gate contacts 102, which include a barrier layer 104, a seed layer 109, and a conductive material 110, are formed in the contact openings and are electrically coupled to the gate structures 84A and 84B.

In an embodiment, the second ILD 95 is a flowable film formed by a flowable CVD method. In some embodiments, the second ILD 95 is formed of a dielectric material such as PSG, BSG, BPSG, USG, or the like, and may be deposited by any suitable method, such as CVD and PECVD. The contact openings may be formed using photolithography and etching. The materials and the formation methods for the barrier layers 104, the seed layer 109 and the conductive material 110 may be similar to those discussed above for the gate structures 84A/84B, thus details are not repeated.

Variations and modifications to the present disclosure are possible, and are fully intended to be included within the scope of the present disclosure. For example, one fin 64A is illustrated in the region 200 and one fin 64B is illustrated in the region 300. However, more than one fins may be formed in each region (e.g., 200 or 300), and the gate structure 84A and/or 84B may straddle more than one fins. As another example, the disclosed method may also be used to form two gate structures 84A and 84B that are of a same type, e.g., both gate structures 84A and 84B may be gate structures of P-type transistors (or N-type transistors). As yet another example, the layer stack 81/83/85 may comprise different materials from the layer stack 81'/83'/85', e.g., to form different gate dielectric materials 81 and 81' for the PMOS region and the NMOS region, respectively.

Figure 22:
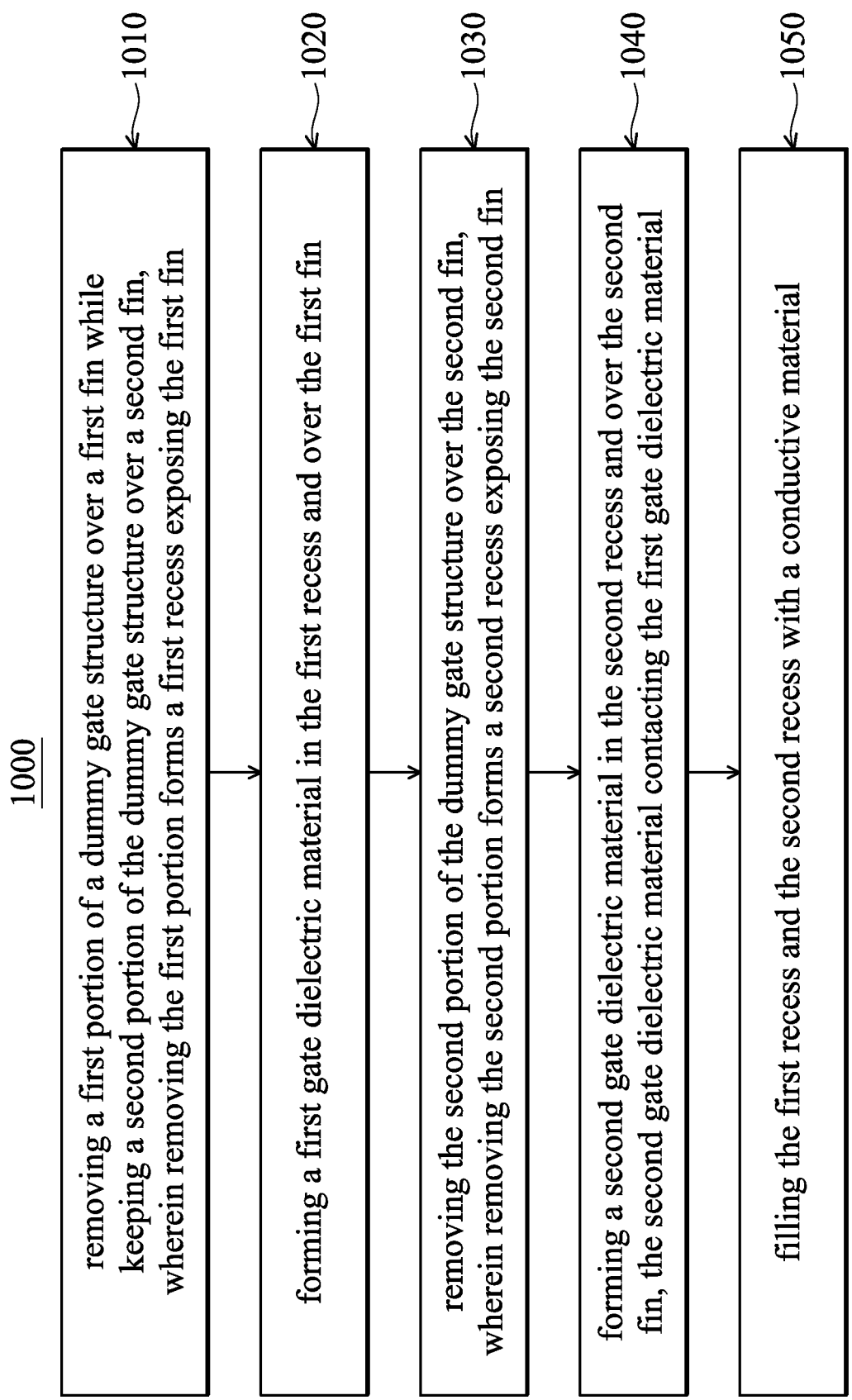
FIG. 22 illustrates a flow chart of method of making a semiconductor device, in accordance with some embodiments.

FIG. 22 illustrates a flow chart of a method of forming a gate dielectric material, in accordance with some embodiments. It should be understood that the embodiment method shown in FIG. 22 is merely an example of many possible embodiment methods. One of ordinary skill in the art would recognize many variations, alternatives, and modifications. For example, various steps as illustrated in FIG. 22 may be added, removed, replaced, rearranged and repeated.

Referring to FIG. 22, at step 1010, a first portion of a dummy gate structure over a first fin is removed while a second portion of the dummy gate structure over a second fin remains, where removing the first portion forms a first recess exposing the first fin. At step 1020, a first gate dielectric material is formed in the first recess and over the first fin. At step 1030, the second portion of the dummy gate structure over the second fin is removed, where removing the second portion forms a second recess exposing the second fin. At step 1040, a second gate dielectric material is formed in the second recess and over the second fin, the second gate dielectric material contacting the first gate dielectric material. At step 1050, the first recess and the second recess are filled with a conductive material.

Embodiments may achieve advantages. For example, the disclosed embodiment obviates the need to from cut patterns to cut a metal gate into separate metal gates. As a result, problems associated with forming cut patterns, such as bridge issue (e.g., electrical shorts), and difficulty with filling high aspect ratio holes, are avoided. In addition, contamination or damage to the metal gate structures due to metal gate cutting is avoided, which results in better device performance (e.g., smaller leakage current). The metal gate structures formed using the present disclosed method are insulated by the gate dielectric material, thus the size of the gate structures and the fin-to-fin pitch can be much smaller than existing processing methods, which allows for higher integration density and lower manufacturing cost.

In an embodiment, a method includes removing a first portion of a dummy gate structure over a first fin while keeping a second portion of the dummy gate structure over a second fin, where removing the first portion forms a first recess exposing the first fin; forming a first gate dielectric material in the first recess and over the first fin; and removing the second portion of the dummy gate structure over the second fin, where removing the second portion forms a second recess exposing the second fin. The method further includes forming a second gate dielectric material in the second recess and over the second fin, the second gate dielectric material contacting the first gate dielectric material; and filling the first recess and the second recess with a conductive material. In an embodiment, the second recess exposes at least a portion of the first gate dielectric material. In an embodiment, forming the second gate dielectric material includes conformally forming the second gate dielectric material in the second recess, where the second gate dielectric material contacts and extends along the portion of the first gate dielectric material exposed by the second recess. In an embodiment, removing the first portion of the dummy gate structure includes an anisotropic etch process, where removing the second portion of the dummy gate structure includes an isotropic etch process. In an embodiment, the anisotropic etch process is performed in a first etching step followed by a second etching step, wherein the first etching step uses a different etchant from the second etching step. In an embodiment, the method further includes filling the first recess with a first sacrificial material after forming the first gate dielectric material and before removing the second portion of the dummy gate structure. In an embodiment, the first sacrificial material includes a metal. In an embodiment, the method further includes filling the second recess with a second sacrificial material after forming the second gate dielectric material and before filling the first recess and the second recess with a conductive material. In an embodiment, the first sacrificial material is a same material as the second sacrificial material. In an embodiment, the method further includes removing the first sacrificial material and the second sacrificial material from the first recess and the second recess, respectively, before filling the first recess and the second recess with a conductive material. In an embodiment, the method further includes performing a planarization process to remove top portions of the first sacrificial material and top portions of the second sacrificial material before removing the first sacrificial material and the second sacrificial material.

In an embodiment, a method of forming a Fin Field-Effect Transistor (FinFET) includes forming a first fin in a first region over a substrate; forming a second fin in a second region over the substrate, the second fin being adjacent to the first fin; forming a first gate structure over the first fin and the second fin; and removing a first portion of the first gate structure in the first region to form a first recess. The method also includes forming a first gate dielectric material lining sidewalls and a bottom of the first recess; depositing a first material in the first recess and over the first gate dielectric material; and removing a remaining portion of the first gate structure in the second region to form a second recess, the second recess exposing a first portion of the first gate dielectric material. The method further includes forming a second gate dielectric material lining sidewalls and a bottom of the second recess; depositing a second material in the second recess and over the second gate dielectric material; removing the first material and the second material from the first recess and the second recess, respectively; and filling the first recess and the second recess with a conductive material to form a first gate electrode and a second gate electrode, respectively. In an embodiment, forming the second gate dielectric material includes forming a first portion of the second gate dielectric material along the first portion of the first gate dielectric material exposed by the second recess. In an embodiment, depositing the second material includes depositing the second material in the second recess and over the first material; and performing a planarization process to remove a top portion of the second material and to expose the first material. In an embodiment, forming the second gate dielectric material includes forming the second gate dielectric material over the first gate dielectric material, where after forming the second gate dielectric material, the first material is between the first gate dielectric material and the second gate dielectric material. In an embodiment, the first region is a P-type device region, and the second region is an N-type device region.

In an embodiment, a Fin Field-Effect Transistor (FinFET) device includes a first fin over a substrate; a second fin over the substrate and adjacent to the first fin; and a first gate structure over the first fin, the first gate structure including a first gate dielectric layer over the first fin; and a first gate electrode over the first gate dielectric layer. The FinFET device also includes a second gate structure over the second fin, the second gate structure including a second gate dielectric layer over the second fin; and a second gate electrode over the second gate dielectric layer, where a first portion of the first gate dielectric layer along a first sidewall of the first gate electrode contacts a second portion of the second gate dielectric layer along a second sidewall of the second gate electrode. In an embodiment, the first gate structure further includes a capping layer over the first gate dielectric layer; and a barrier layer over the capping layer, where the barrier layer is between the first gate electrode and the capping layer. In an embodiment, the capping layer comprises titanium nitride (TiN), and the barrier layer comprises tantalum nitride (TaN). In an embodiment, the first gate dielectric layer and the second gate dielectric layer comprise a same dielectric material, where the same dielectric material extends continuously from the first fin to the second fin.

In an embodiment, a method of forming Fin Field-Effect Transistor (FinFET) devices includes forming a dummy gate structure over a first fin and over a second fin, where the dummy gate structure extends continuously from the first fin to the second fin and is surrounded by a dielectric layer; performing a first removal process to remove a first portion of the dummy gate structure over the first fin while masking a second portion of the dummy gate structure over the second fin during the first removal process, where the first removal process forms a first recess in the dielectric layer; and forming a first gate dielectric material in the first recess. The method also includes depositing a first sacrificial material in the first recess and over the first gate dielectric material; performing a second removal process to remove the second portion of the dummy gate structure over the second fin, where the second removal process forms a second recess in the dielectric layer; and forming a second gate dielectric material in the second recess. The method further includes depositing a second sacrificial material in the second recess and over the second gate dielectric material; removing the first sacrificial material and the second sacrificial material; and filling the first recess and the second recess with a conductive layer. In an embodiment, the first removal process is an anisotropic etch process, and the second removal process is an isotropic etch process. In an embodiment, the second recess exposes the first gate dielectric material. In an embodiment, the first sacrificial material and the second sacrificial material comprise a same alloy.

In an embodiment, a Fin Field-Effect Transistor (FinFET) device includes a first fin above a substrate; a second fin above the substrate and adjacent to the first fin; and a first gate structure over the first fin, the first gate structure including a first gate electrode; and a first gate dielectric layer between the first gate electrode and the first fin. The FinFET device also includes a second gate structure over the second fin, the second gate structure including a second gate electrode; and a second gate dielectric layer between the second gate electrode and the second fin, where the first gate electrode is separated from the second gate electrode, where the first gate dielectric layer contacts the second gate dielectric layer. In an embodiment, the first gate dielectric layer has a first portion extending along a sidewall of the first gate electrode, and the second gate dielectric layer has a first portion extending along a sidewall of the second gate electrode, where the first portion of the first gate dielectric layer contacts the first portion of the second gate dielectric layer. In an embodiment, the first portion of the first gate dielectric layer and the first portion of the second gate dielectric layer have a same height measured along the sidewall of the first gate electrode. In an embodiment, the first gate dielectric layer has a second portion extending along an upper surface of an isolation region between the first fin and the second fin, where the first portion of the first gate dielectric layer and the first portion of the second gate dielectric layer are substantially perpendicular to the second portion of the first gate dielectric layer.

In an embodiment, a Fin Field-Effect Transistor (FinFET) device includes a first fin and a second fin adjacent to the first fin; and a first gate structure over the first fin and a second gate structure over the second fin, where a first gate electrode of the first gate structure is separated from a second gate electrode of the second gate structure by an insulation region, where the insulation region includes a portion of a first gate dielectric layer of the first gate structure and a portion of a second gate dielectric layer of the second gate structure, where the first gate dielectric layer contacts the second gate dielectric layer in the insulation region. In an embodiment, the FinFET device further includes first source/drain regions over the first fin, the first source/drain regions doped with N-type impurities; and second source/drain regions over the second fin, the second source/drain regions doped with P-type impurities.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A Fin Field-Effect Transistor (FinFET) device comprising:
   a first fin over a substrate;
   a second fin over the substrate and adjacent to the first fin, wherein a first longitudinal axis of the first fin is parallel to, but different from, a second longitudinal axis of the second fin;
   a first gate structure over the first fin, the first gate structure comprising:
      a first gate dielectric layer over the first fin; and
      a first gate electrode over the first gate dielectric layer;
   a second gate structure over the second fin, the second gate structure comprising:
      a second gate dielectric layer over the second fin; and
      a second gate electrode over the second gate dielectric layer, wherein a first portion of the first gate dielectric layer along a first sidewall of the first gate electrode contacts a second portion of the second gate dielectric layer along a second sidewall of the second gate electrode.

2. The FinFET device of claim 1, wherein the first gate structure further comprises:
   a capping layer over the first gate dielectric layer; and
   a barrier layer over the capping layer, wherein the barrier layer is between the first gate electrode and the capping layer.

3. The FinFET device of claim 2, wherein the capping layer comprises titanium nitride (TiN), and the barrier layer comprises tantalum nitride (TaN).

4. The FinFET device of claim 1, wherein the first gate dielectric layer and the second gate dielectric layer comprise a same dielectric material, wherein the same dielectric material extends continuously from the first fin to the second fin.

5. The FinFET device of claim 1, wherein the first portion of the first gate dielectric layer and the second portion of the second gate dielectric layer have a same height measured along a direction perpendicular to a major upper surface of the substrate.

6. The FinFET device of claim 1, wherein the first portion of the first gate dielectric layer and the second portion of the second gate dielectric layer form an insulation region between the first gate electrode and the second gate electrode, wherein a width of the insulation region is equal to a sum of a first thickness of the first gate dielectric layer and a second thickness of the second gate dielectric layer.

7. The FinFET device of claim 6, wherein the width of the insulation region is between 1.5 nm and 6 nm.

8. The FinFET device of claim 6, wherein a distance between the first fin and the insulation region is between 10 nm and 30 nm.

9. The FinFET device of claim 1, wherein a distance between the first fin and the second fin is smaller than 46 nm.

10. The FinFET device of claim 1, wherein the first gate structure is in an N-type device region, and the second gate structure is in a P-type device region.

11. The FinFET device of claim 10, wherein the first gate dielectric layer and the second gate dielectric layer comprise different materials.

12. A Fin Field-Effect Transistor (FinFET) device comprising:
    a first fin;
    a first gate electrode over the first fin;
    a first layer stack between the first fin and the first gate electrode, the first layer stack comprising a first gate dielectric layer, the first layer stack having a first thickness;
    a second fin adjacent to the first fin;
    a second gate electrode over the second fin; and
    a second layer stack between the second fin and the second gate electrode, the second layer stack comprising a second gate dielectric layer, the second layer stack having a second thickness, wherein a distance between the first gate electrode and the second gate electrode, measured along a first direction perpendicular to a longitudinal direction of the first fin, is equal to a sum of the first thickness and the second thickness.

13. The FinFET device of claim 12, wherein a sidewall portion of the first gate dielectric layer extends along a sidewall of the first gate electrode, and a sidewall portion of the second gate dielectric layer extends along a sidewall of the second gate electrode, wherein the sidewall portion of the first gate dielectric layer is in physical contact with the sidewall portion of the second gate dielectric layer.

14. The FinFET device of claim 13, wherein the sidewall portion of the first gate dielectric layer and the sidewall portion of the second gate dielectric layer have a same height.

15. The FinFET device of claim 12, wherein the first gate dielectric layer and the second gate dielectric layer comprise a same dielectric material, wherein the same dielectric material extends continuously from the first fin to the second fin.

16. The FinFET device of claim 12, wherein the first layer stack further comprises:
    a capping layer between the first gate dielectric layer and the first gate electrode; and
    a barrier layer between the capping layer and the first gate electrode.

17. The FinFET device of claim 16, wherein the second layer stack has a same structure as the first layer stack.

18. A Fin Field-Effect Transistor (FinFET) device comprising:
    a first fin extending along a first lengthwise direction;
    a first gate structure over the first fin, the first gate structure comprising:
       a first gate dielectric layer over the first fin; and
       a first gate electrode over the first gate dielectric layer;
    a second fin adjacent to the first fin, the second fin extending along a second lengthwise direction, wherein the first lengthwise direction and the second lengthwise direction are parallel to each other but along two different lines; and
    a second gate structure over the second fin, the second gate structure comprising:

a second gate dielectric layer over the second fin; and a second gate electrode over the second gate dielectric layer, wherein the first gate dielectric layer has a first portion that extends along and contacts a second portion of the second gate dielectric layer.

19. The FinFET device of claim 18, wherein the first portion of the first gate dielectric layer extends along a sidewall of the first gate electrode, and the second portion of the second gate dielectric layer extends along a sidewall of the second gate electrode.

20. The FinFET device of claim 18, wherein the first portion of the first gate dielectric layer has a same height as the second portion of the second gate dielectric layer.

* * * * *